United States Patent
Gammel et al.

(10) Patent No.: US 12,482,709 B2
(45) Date of Patent: Nov. 25, 2025

(54) FAST BEAM CALIBRATION PROCEDURE FOR BEAMLINE ION IMPLANTER

(71) Applicant: Applied Materials, Inc., Santa Clara, CA (US)

(72) Inventors: George M. Gammel, Marblehead, MA (US); Eric Donald Wilson, Rockport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 920 days.

(21) Appl. No.: 17/700,048

(22) Filed: Mar. 21, 2022

(65) Prior Publication Data

US 2023/0057995 A1 Feb. 23, 2023

Related U.S. Application Data

(60) Provisional application No. 63/235,508, filed on Aug. 20, 2021.

(51) Int. Cl.
| | | |
|---|---|---|
| *H01L 21/66* | (2006.01) | |
| *H01J 37/147* | (2006.01) | |
| *H01J 37/304* | (2006.01) | |
| *H01J 37/317* | (2006.01) | |

(52) U.S. Cl.
CPC .......... *H01L 22/10* (2013.01); *H01J 37/1474* (2013.01); *H01J 37/304* (2013.01); *H01J 2237/24542* (2013.01)

(58) Field of Classification Search
CPC ..... H01L 22/10; H01J 37/1474; H01J 37/304; H01J 2237/24542; H01J 37/3171
See application file for complete search history.

(56) References Cited

U.S. PATENT DOCUMENTS

| | | | |
|---|---|---|---|
| 10,658,156 B1* | 5/2020 | Todorov | H01J 37/3023 |
| 2002/0066863 A1* | 6/2002 | Chao | H01J 37/304 |
| | | | 250/397 |
| 2002/0134948 A1* | 9/2002 | Olson | H01J 37/304 |
| | | | 250/492.21 |
| 2006/0121707 A1 | 6/2006 | Lee | |
| 2006/0145096 A1 | 7/2006 | Benveniste | |
| 2007/0194227 A1 | 8/2007 | Dolan | |
| 2008/0067444 A1 | 3/2008 | Benveniste et al. | |
| 2016/0189928 A1 | 6/2016 | Vanderberg et al. | |
| 2019/0139740 A1* | 5/2019 | Wilson | H01J 37/244 |

FOREIGN PATENT DOCUMENTS

| | | |
|---|---|---|
| JP | 2008527638 A | 7/2008 |
| TW | 202013444 A | 4/2020 |
| WO | 2008124418 A1 | 10/2008 |

OTHER PUBLICATIONS

International Search Report and Written Opinion dated Oct. 21, 2022, for the International Patent Application No. PCT/US2022/034676, filed on Jun. 23, 2022, 6 pages.

* cited by examiner

*Primary Examiner* — Robert H Kim
*Assistant Examiner* — Laura Eloise Tandy
(74) *Attorney, Agent, or Firm* — KDW Firm, PLLC

(57) ABSTRACT

A method includes receiving a spot beam profile is received for a spot ion beam; receiving a linear scanned beam profile for the spot ion beam; generating a calculated calibration spot profile, based upon the spot beam profile and the linear scanned beam profile; and implementing an adjusted scanned profile for the spot ion beam, based upon the calculated calibration spot profile.

19 Claims, 11 Drawing Sheets

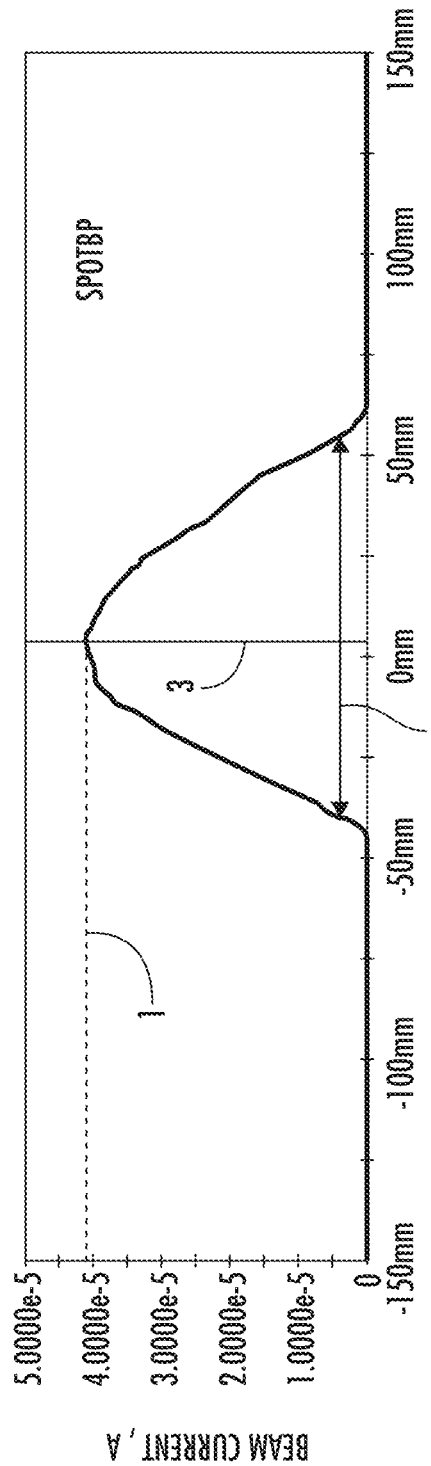
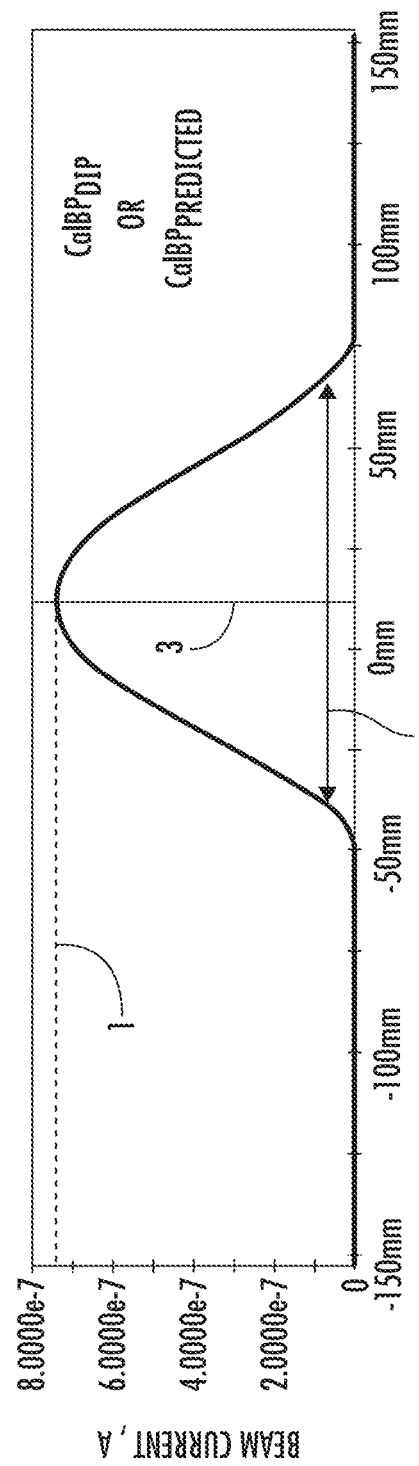

FAST BEAM CALIBRATION PROCEDURE FOR BEAMLINE ION IMPLANTER

RELATED APPLICATIONS

This application claims priority to U.S. provisional patent application Ser. No. 63/235,508, filed Aug. 20, 2021, entitled FAST BEAM CALIBRATION PROCEDURE FOR BEAMLINE ION IMPLANTER, and incorporated by reference herein in its entirety,

FIELD

The present embodiments relate to processing apparatus and methods, and more particularly, to methods to control beam current in ion implantation processes.

BACKGROUND

In the present day, various types of processing apparatus are employed to treat or process substrates with ions. For processing substrates such as semiconductor substrates, ions may be used to etch layers or features on a substrate. Ions may also be used to deposit a layer or structures on a substrate, to implant a species into a substrate, or to amorphize a substrate. Techniques have also been developed to monitor processing of a substrate in order to control the processing of a substrate.

In order to provide accurate dose control for ion implantation of a substrate using a scanned spot beam, current monitors may be provided at or near a substrate, such as Faraday cup monitors. In some ion implanters, a Faraday cup may be provided adjacent to a substrate to intercept a spot beam scanned back and forth along a first direction to calibrate an ion implantation procedure. Generally during implantation of a series of substrates (wafers) beam calibration procedures are periodically performed using such current monitors to "tune" the scanning of an ion beam in order to ensure the proper ion dose is provided across a wafer.

There is a constant drive to increase the productivity of ion implanters by reducing the amount of "tune" time employed for such calibration process with uniform current density across the wafer plane. In a given tuning operation to calibrate ion implantation for a scanned spot beam, a "stationary" spot beam profile (SpotBP) is obtained, in addition to various scanned beam profiles (ScannedBPs), where beam current is measured while the spot beam is rapidly scanned back and forth along a predetermined scan direction. Each of the various profiles requires a given duration to execute. For example, an averaged collection of 16 SpotBPs may require a duration of 3 seconds while a single scanned beam profile may require on the order of 12 seconds. Accordingly, the total calibration time for an ion beam may be at least 27 seconds, including at least one SpotBP and at least two ScannedBPs. Furthermore, the total uniformity tuning or calibration time for an ion beam in this scenario may require at least 39 seconds, since the uniformity tuning includes the 27 sec calibration time plus at least one adjusted scan after calibration, termed a ScannedBP$_{Adjusted}$, involving an additional 12 seconds. Note that a given wafer implantation procedure may require just several seconds duration, so implantation of a 25 wafer batch may entail just several minutes or less. Accordingly, when beam calibration is performed before implantation of every wafer batch, the beam calibration may constitute a large fraction of the total implantation time, thus limiting wafer throughput.

With respect to these and other considerations the present improvements may have been needed.

SUMMARY

The present embodiments relate to methods, articles, and ion implantation apparatus for implementing improved spot beam calibration. In one embodiment, a method may include receiving a spot beam profile for a spot ion beam; receiving a linear scanned beam profile for the spot ion beam; generating a calculated calibration spot profile, based upon the spot beam profile and the linear scanned beam profile; and implementing an adjusted scanned profile for the spot ion beam, based upon the calculated calibration spot profile.

In another embodiment, an apparatus for controlling scanning of an ion beam, is provided. The apparatus may include a beam scanner to scan a spot ion beam with respect to a substrate; a detector, to measure current of the ion beam; and a beam calibration component, comprising a controller and a memory. The memory may include a calibration routine. The calibration routine may be operative on the controller to receive a spot beam profile for the spot ion beam; receive a linear scanned beam profile of the spot ion beam; generate a calculated calibration spot profile, based upon the spot beam profile and the linear scanned beam profile; and implement an adjusted scanned profile for the spot ion beam, based upon the calculated calibration spot profile.

In another embodiment, a non-transitory computer-readable storage medium is provided, including a set of instructions. The set of instructions, when executed by a computer, may cause the computer to: receive a spot beam profile for the spot ion beam; receive a linear scanned beam profile of the spot ion beam; generate a calculated calibration spot profile, based upon the spot beam profile and the linear scanned beam profile; and implement an adjusted scanned profile for the spot ion beam, based upon the calculated calibration spot profile.

BRIEF DESCRIPTION OF THE DRAWINGS

FIG. 2A shows a composite illustration including menu items and a graphical representation of the signals associated with a spot beam profile, according to the present embodiments;

FIG. 2B is a composite illustration including menu items and a graphical representation of the signals associated with a predicted calibration spot profile;

DETAILED DESCRIPTION

Figure 1A:
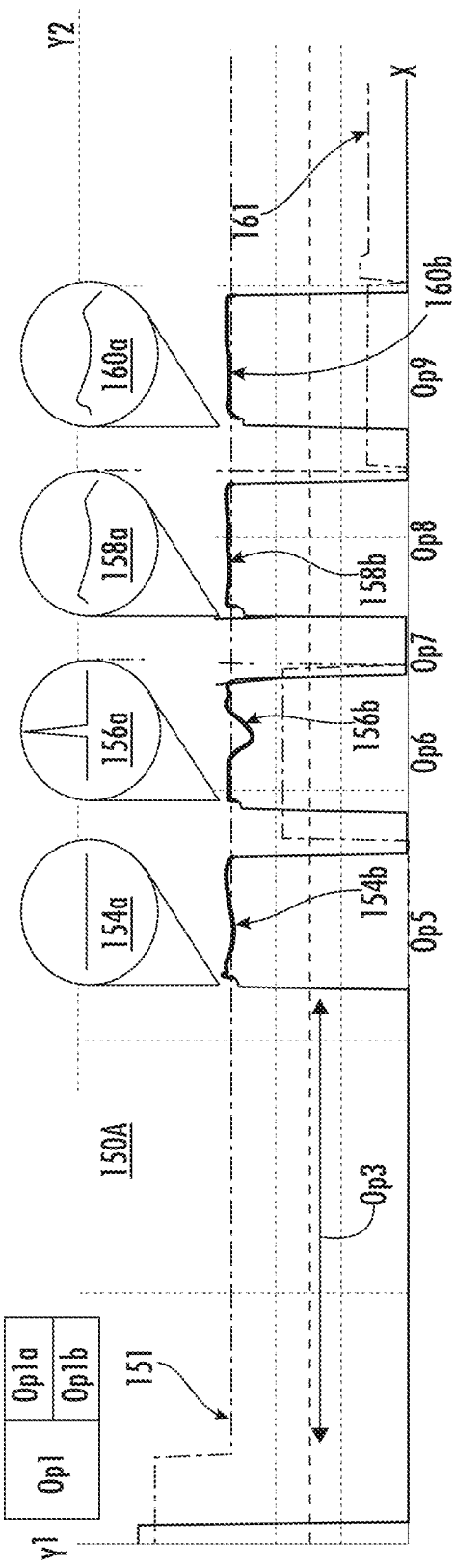
FIG. 1A illustrates basic components for a reference ion beam calibration that may be implemented in a spot beam ion implantation system.

The present embodiments will now be described more fully hereinafter with reference to the accompanying drawings, where some embodiments are shown. The subject matter of the present disclosure may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein provide novel techniques to improve beam calibration for an ion implanter, and ion implantation throughput.

According to various embodiments of the disclosure, a more rapid approach is provided for ion beam calibration, also referred to as ion beam tuning or beam tuning. By way of reference, FIG. 1A illustrates basic components for ion beam calibration that may be implemented in a spot beam ion implantation system, where ion implantation is carried out by exposing a substrate to a scanned spot beam. In particular, the spot beam may be scanned or rastered back and forth across a substrate along a given beam scan axis at a rate on the order of a few kHz, for example. Exposure of an entire substrate may be accomplished by scanning of a substrate stage at a much slower rate along a given axis, such as orthogonal to the beam scan axis, while the spot beam is rapidly scanned along the beam scan axis. Before exposure of the substrate, a uniformity tuning routine will generate a scanned ion beam where the ion beam scan velocity is adjusted across a beam scan axis so that the substrate will be exposed to a uniform ion density. Because of ion beam density uniformity requirements, ion beam tuning may be performed on a regular, frequent basis, such as before each batch of substrates (e.g., 25 wafers) is implanted. For a given implantation recipe, including a given ion species and a given set of implant conditions, a predetermined calibration procedure to generate this scanned beam of uniform density, which entity may be referred to as ScannedBP$_{Adjusted}$, may be implemented before a given wafer batch is implanted. In the description to follow, procedures, steps, routines, or algorithms, and the like, may be also referred to as operations or as sub-operations.

In FIG. 1A, a composite illustration is shown including menu items and a graphical representation of the signals associated with a series of known operations that constitute a calibration procedure 150A. The y-axis may represent measured beam current, for example, or alternatively scan velocity of a spot beam. The x-axis represents time. A series of reference operations are denoted in the calibration procedure 150A by the numbers Op1-Op9. A select sub-set group of the reference operations of FIG. 1a, including at least operations Op1, Op3, Op5, Op6, Op7, Op8 and Op9 may be performed in accordance with embodiments of the disclosure. The complete sum of operations shown in FIG. 1A, including operations Op1-Op9, may be deemed to constitute a reference calibration procedure.

In the operation Op1, a SpotBP procedure is performed to obtain two metrics required for uniformity tuning: Beam-Center and HalfWidth. These parameters are used to determine how far the (electrostatically) scanned spot beam is scanned to the inside "right" side of a wafer and outside "left" side of the wafer before turning around. Once the horizontal scan 'turn-around' positions are determined, the standard calibration procedure as outlined in calibration procedure 150A does not employ any metrics (including shape) of the SpotBP measurement for the remainder of the calibration procedure.

In different implementations, a SpotBP measurement may be performed by the relative scanning of a sensor across a stationary beam or by relative scanning of a spot beam across a stationary sensor at a low beam scan rate. In the operation Op1a, the spot beam profile is measured by scanning a profiler faraday cup sensor across an undeflected stationary spot beam. This operation may take ~12 seconds and is referred to as a Slow Spot Profile SpotBP$_{Slow}$. In the operation of Op1b, a profiler faraday cup sensor remains stationary in the center of the wafer plane at 0 mm and a spot beam is swept across the profiler faraday cup sensor several times, such as 16 times to obtain an average current response. When this beam sweep response is transformed from a time-domain current response to a position-domain current response, the result closely resembles the SpotBP$_{Slow}$. This operation of Op1b may be referred to as a Fast Spot Profile SpotBP$_{Fast}$ and may require ~3 seconds. This method for creating the CalBP$_{Predicted}$ will assume that the spot beam has been measured with either a SpotBP$_{Slow}$ or a SpotBP$_{Fast}$. For the purpose of simplification, this spot beam measurement will be referred to SpotBP instead of SpotBP$_{Slow}$ or SpotBP$_{Fast}$ when describing the method of creating the CalBP$_{Predicted}$. An estimate of the uniform current beam density is calculated during Op1a or Op1b and is updated as shown in value 151 of Calibration Procedure 150A, 150B and 150C. The total integrated current of this SpotBP (which produces this 151 uniform density estimate) is not used in the Calibration Procedure 150A. It is used, however in the embodiments of Calibration Procedure 150b and 150C described later.

In operation Op3, the horizontal and vertical angles of the scanned spot beam are measured and tuned. These angle measurements are not used in the uniformity tune routine operations of operations Op4-Op9.

In operation Op5, the uniformity tune routine commences with the generation and measurement of a Linear Scanned beam Profile ScannedBP$_{Linear}$. The ScannedBP$_{Linear}$ is generated by scanning the spot ion beam across the predetermined horizontal scan distance (determined at operation 1) at a constant velocity. The scan velocity of the spot beam is represented by curve 154a. The subsequent measurement of the ScannedBP$_{Linear}$—may take ~12 seconds to perform, as shown. The resulting measured beam current density is shown in curve 154B. As illustrated, while the scan speed (curve 154a) remains at a constant value, during the time interval, the measured spot beam current exhibits some fluctuations in beam density, corresponding to different positions This ScannedBP$_{Linear}$—is used to obtain a Dip Calibration Spot Profile CalBP$_{Dip}$ in operation Op7.

Before describing Op6, a definition of μ-Slope (microslope) will be given. The ion beam is electrostatically scanned horizontally at a high frequency (~1 kHz) over a pre-determined horizontal scan distance that ensures that the beam is completely beyond the edge of the wafer and any side faradays before the electrostatic scan turns the beam around. This horizontal scan distance depends on several factors such as beam width and is generally between 350 mm and 600 mm for 300 mm wafers. In order to fill in and "flatten" beam density non-uniformities across the wafer place, the beam scan system must be able to speed up and slow down the scan speed to flatten out beam density "bumps" and "dips" respectively. In order to keep track of where the beam scan speed is changed and by how much, the horizontal scan distance (for example, 400 mm) is divided up into a fixed number (for example, 30) of distinct speed change steps where each step specifies the desired velocity of the beam at that location. In this example, each µ-Slope will be 13.33 mm wide (400 mm scan distance/30 speed change locations). For the remainder of this document, a µ-Slope may be referred to as a micro-slope or µ-slope, slope pitch or slope. This series of 30 µ-Slope beam velocities sent to the beam scanner electronics which converts it the series of electrostatic scan speeds that make up a single right→left scan of the ion beam across the horizontal scan distance (positive mm to negative mm). When the scanner turns around for the reverse direction it will scan with a mirror image of this µ-Slope waveform so that the left→right scan speeds overlap with the right→left scan speeds. There is an "matching-circuit" electronic delay between when a µ-Slope speed change is delivered to the scanner system (with this 30 point array) and when it actually happens. This delay and how it affects the embodiment is taken into account and described later.

In operation Op6, another scanned profile (curve 156b) is taken while the velocity of the scanned beam is increased by 2× over a distance of ~10-15 mm (µ-Slope width) at the center of the wafer plane (curve 156a). In other words, over a small portion of the scan length (~400 mm total) the spot beam scanning is deliberately sped up by a factor of 2. This operation may be referred to as a Dip Calibration Scanned Profile ScannedBP$_{Dip}$, and may also take ~12 seconds to perform.

In operation Op7, the so-called Dip Calibration Spot Profile CalBP$_{Dip}$ is created by subtracting the ScannedBP$_{Dip}$ (curve 156b) from the ScannedBP$_{Linear}$ (curve 154b). On this basis, the uniformity tune routine has obtained the deliberately decreased beam density effect that results when the spot beam scan speed is increased by 2× over a certain distance (µ-Slope width). This information is the central piece of information that the uniformity tune routine needs in order to generate the overall uniform beam density required, before implantation of wafers is to commence. The uniformity tune routine now "knows" how much to change the speed of the spot beam as the spot beam is being scanned in order to "fill-in" beam density dips and "flatten out" beam density bumps to create a scanned ion beam of uniform density.

In operation Op8, a first Adjusted Scanned Profile ScannedBP$_{Adjusted}$ is taken (curve 158b). This operation is the result of the first estimate in the tuning routine as to how the speed of the scanned spot beam should be varied (curve 158a) across the horizontal spot beam scan distance in order to make the ion beam current density uniform across the wafer plane. Note that the ScannedBP$_{Adjusted}$ operation involves adjusting the spot beam scan velocity as shown by curve 158A, rather than applying a uniform scan velocity (curve 154a) to the spot beam. As such, the scan speed pattern of the spot beam should provide the right compensation to adjust for the non-uniformity in beam current measured in the operation Op5 with the ScannedBP$_{Linear}$. At the same time, the beam current density is measured as shown by curve 158b. As evident, there are still some "dips" and "bumps" in the beam current density in operation Op8 that need to be further flattened out. The beam tuning routine in operation Op9 fine tunes the variation in the scanned beam speed (curve V160a) to flatten out these residual variations in the beam density (curve V160b) and the result is measured in a second Op9 ScannedBP$_{Adjusted}$. Each ScannedBP$_{Adjusted}$ involves first generating the scanned beam waveform with adjustments to the scan speed and then measuring the resulting beam density with a mechanical left to right scan of the Faraday detector to make sure the measured current density along the horizontal beam scan axis passes a uniformity "flatness" specification When the overall uniformity passes below the acceptable uniformity sigma the uniformity tune routine is complete and wafer implantation may be commenced. In FIG. 1A, the operation Op8 is shown as being repeated in a single instance (Op9), resulting in what may be deemed an acceptable beam uniformity. The changes in the calculated sigma value of each scanned profile measurement is shown in updates to line 161. This is the measured sigma value that is compared to the specification limit after each ScannedBP$_{Adjusted}$ to see if it is below the limit before wafer implantation can start.

In various embodiments of the disclosure, the beam calibration routine outlined in FIG. 1A may be modified, in particular by performing additional novel operations (as shown in Calibration Procedure 150b, FIG. 1B) that result in the ability to omit the ~12 second ScannedBP$_{Dip}$ operation Op6 of the Calibration Procedure 150A (FIG. 1A). As a result, using a calibration routine, referred to herein as a predicted calibration spot profile (PCSP) routine, overall calibration time may be significantly reduced, by up to nearly 12 seconds, using the Calibration Procedure 150B example of FIG. 1B. As an example, in a modified calibration routine (as outlined by the calibration procedure 150B) of the present embodiments, the operation Op1, as outlined above, is still performed to measure the beam Center and HalfWidth in order to determine the horizontal scan distance and turn-around positions of the scanned beam. To obtain the CalBP$_{Predicted}$ and skip the ScannedBP$_{Dip}$ for the PSCP routine, however, the shape and integrated current (area) of this Spot Profile SpotBP are also used in operations to follow. Operation Op3 to measure and adjust horizontal and vertical beam angles is also performed in the PCSP routine, generally as described above. After operation Op3, the uniformity tune portion of the PCSP routine begins with performing of operation Op5, the ScannedBP$_{Linear}$, as described above with respect to FIG. 1B.

Figure 1B:
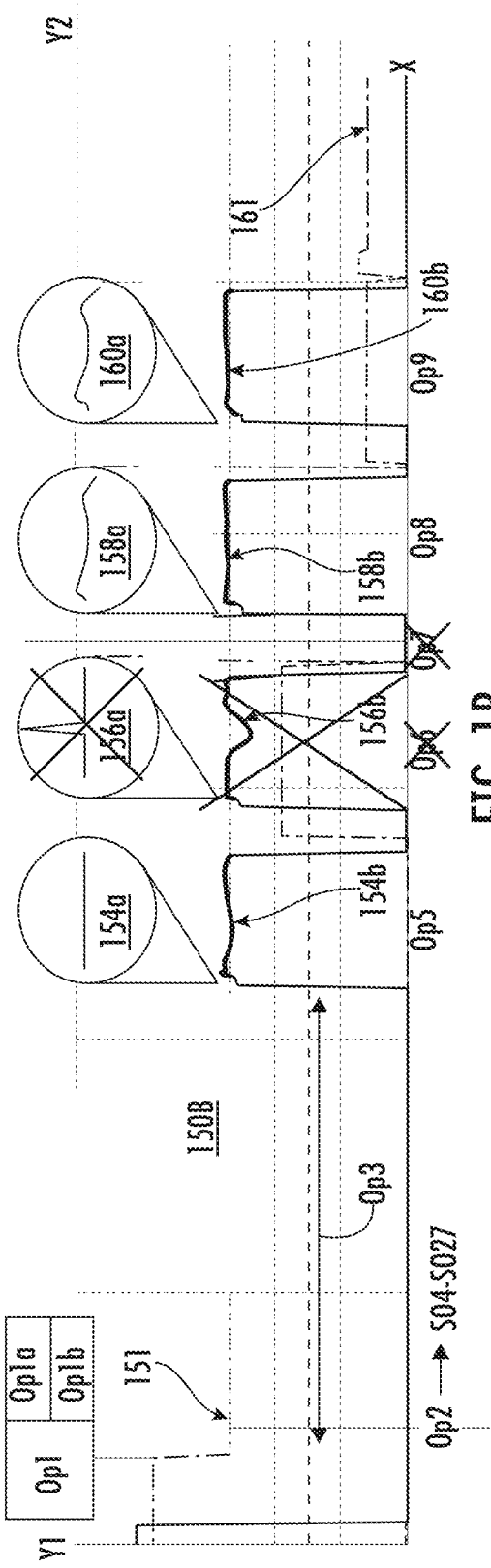
FIG. 1B illustrates basic components for an ion beam calibration that may be implemented in a spot beam ion implantation system, according to an embodiment of the disclosure.

Unlike the example of FIG. 1A, the operation Op6 ScannedBP$_{Dip}$ is omitted in the PCSP routine of FIG. 1B, saving approximately 12 seconds in calibration time. This time saving may correspond to a ~13% improvement in an overall tuning routine. In the approach according to the present embodiments, in a modified version of operation Op7, an adjusted waveform is created by utilizing a predicted calibration spot profile CalBP$_{Predicted}$, as detailed below. Because this ScannedBP$_{Dip}$ is skipped, the measured effect of increasing the beam velocity by 2× over the µ-Slope width (~10-15 mm) is unknown.

To compensate for not directly measuring the effect of increasing the beam velocity by 2×, for example, the PCSP routine creates a CalBP$_{Predicted}$ which profile provides an accurate prediction of what the CalBP$_{Dip}$ would have been. According to various embodiments of the disclosure, the PCSP routine is based upon most or all of the following measurements: A listing of the measurements that may form part of the PCSP routine is provided below, together with some non-limiting ranges for parameters used in these measurements.

A stationary SpotBP shape, HalfWidth, Center and Integrated Current (area)

The width and position of the µ-Slope width (e.g., 10-15 mm)

The HorizontalScanDistance (e.g., 400 mm-600 mm)
The Beam Scan Time (e.g., 400 µSec to 2,000 µSec)
The speed of the mechanical profiler (e.g., 32 mm/Sec or 96 mm/Sec)
The dose controller matching circuit delay for a µ-Slope speed change~e.g., 6 µSec The creation of this $CalBP_{Predicted}$ is done in Op2 of Calibration Procedure 150B (FIG. 1B) and is described below. Note that all of these measurements are collected before the uniformity tune routine portion of the PCSP commences. Therefore, according to embodiments of the disclosure, the PCSP Uniformity calibration can commence with the $1^{st}$ $ScannedBP_{Adjusted}$ immediately after the $ScannedBP_{Linear}$ (operation Op5) is complete.

After the $CalBP_{Predicted}$ and the $ScannedBP_{Linear}$ are obtained, one or more $ScannedBP_{Adjusted}$ are taken as described in operation Op8 and Op9 of the Standard Uniformity Tuning. Instead of using the Op7 $CalBP_{Dip}$ that was created with the additional Op6 $ScannedBP_{Dip}$ as outlined in FIG. 1A, the PCSP Uniformity routine will skip over the $ScannedBP_{Dip}$ and use the $CalBP_{Predicted}$ as outlined in FIG. 1B (including Op1, Op2, Op3, Op5, Op8 and Op9 of Calibration Procedure 150B), to make the necessary changes to the velocity of the spot beam as the spot beam is scanned to achieve uniform beam density across the wafer plane.

Note that the aforementioned embodiments highlight procedures for spot beam scan calibration when a new recipe is being implemented, such as a first time implementation. In these scenarios, the operations and sub-operations as generally described above, and including the general operations Op1-Op9 will be implemented. In particular, the first scanned profile for a brand new recipe may always be implemented as a $ScannedBP_{Linear}$, as described above in FIG. 1A and FIG. 1B. According to various embodiments of the disclosure, once the recipe is tuned up (calibration as described above has been performed), the recipe will save the µ-Slopes (curve 160A) beam velocity waveform in the recipe for future use. These µ-Slopes that achieved the uniform beam density (as reflected in operation Op9) may be saved up in the recipe as an array (ranging from 30 to 100, for example) of distinct µ-Slopes. These µ-Slopes tell the ion beam control system what beam scan speed change to apply at a particular location along the wafer plane to make the beam density uniform.

According to embodiments of the disclosure, when the ion beam implantation recipe is re-downloaded (such as immediately after an implantation procedure, or a subsequent week), the calibration routine will automatically recognize that the ion beam implantation recipe in question had been previously calibrated, generally according to the aforementioned procedures. In these embodiments, instead of implementing all of the operations Op1, Op2, Op3, Op5, Op8 and Op9 (as well as sub-operations therein) (of Calibration Procedure 150b) anew the recognition that a previous calibration has been performed on the recipe in question, will trigger the calibration routine to perform an even faster set of operations (Op1, Op2, Op3, Op4, Op8, Op9) as shown in Calibration Procedure 150C of FIG. 1C. For example, rather than ignoring the µ-Slopes obtained during the previous (initial) spot beam scan calibration, and starting from scratch with a new constant velocity $ScannedBP_{Linear}$ (operation Op5), the calibration routine will implement a $ScannedBP_{Recipe}$ (operation Op4) instead, as described in the following.

To create the $ScannedBP_{Recipe}$ the calibration routine retrieves the downloaded µ-Slope array (e.g., 30 to 100 µ-Slopes) (curve 152a), initiates a scan of the spot beam accordingly, and then implements a mechanical profile (curve 152b) of that scanned spot beam with the profile detector, such as a profile Faraday detector. This operation again will consume several seconds, such as 12 seconds. If the scanned spot beam hasn't changed significantly since the last time spot beam calibration was performed, the µ-Slopes from the recipe may still produce a beam density (curve 152b) that is below the uniformity specification limits. If so, then there is no need to make any further scanned beam profiles, and wafer ion implantation using the recipe of interest may commence or resume.

Moreover, if the $ScannedBP_{Recipe}$ (implemented as operation Op4) yields a beam density uniformity that is ABOVE the specification but not "too bad", the PCSP routine may still initiate a reduced calibration operation using the $ScannedBP_{Recipe}$ curve instead of the $ScannedBP_{Linear}$ curve (starting from scratch).

Determination of what result above the specification is acceptable or "not too bad" may be made according to the following considerations. Frequently, the uniformity beam density sigma specification ("sigma" is the statistical measurement of "flatness" of the measured beam density across the wafer plane (as measured by the mechanically a scanned profile detector, such as a Faraday cup detector)) may be set at 0.3% to 0.5%. thus, in one embodiment, if the Sigma is less than 0.5% above the specification, then the $ScannedBP_{Recipe}$ (Curve 152b) may be used. On the other hand, if the Sigma is more than 0.5% above the specification limits, then the $ScannedBP_{Recipe}$ will be ignored and the spot beam calibration routine will start from scratch using the $ScannedBP_{Linear}$.

Figure 1C:
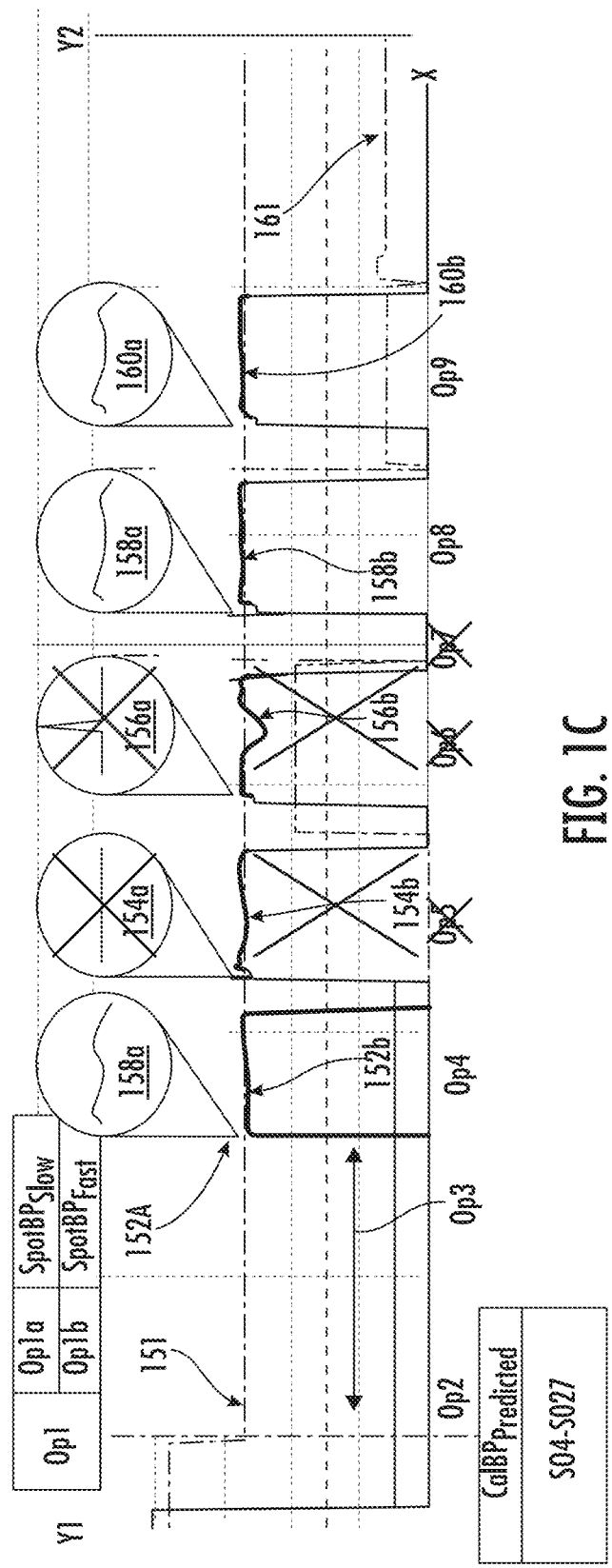
FIG. 1C illustrates basic components for an ion beam calibration that may be implemented in a spot beam ion implantation system according to another embodiment of the disclosure.

In summary, according to embodiments of the disclosure, when the spot beam calibration routine implements the $ScannedBP_{Recipe}$, operation in Calibration Procedure 150C, Op5, Op6 and Op7 can all be omitted during performance of the reduced sot beam calibration routine. This omission of operations Op5, Op6, and Op7 will save substantial calibration time, such as 24 seconds, using the above examples. Thus, the reduced spot beam calibration routine may proceed in the following operation order: Op1, Op2, Op3, Op4, Op8, Op9. Because the $CalBP_{Predicted}$ can be created anywhere between operation Op1 and operation Op4, the routine can start making adjustments immediately and measuring them (operation Op8). The Calibration Procedure 150C as shown in FIG. 1C highlights differences in the implementation of calibration procedures according to the embodiments of this disclosure. The basic calibration may implement operations Op1-Op9, as shown, while in the first implementation of the PCSP routine for a new recipe, a subsequent implementation, using the Op4 $ScannedBP_{Recipe}$, operations Op5, Op6 and Op7 may be omitted.

A goal of the PCSP approach of the present embodiments is to convert a measured entity, a SpotBP, into a $CalBP_{Predicted}$ which, in turn, is used for the uniformity tuning convergence routine. The operations below highlight the major differences between the SpotBP (FIG. 2A) and a $CalBP_{Dip}$ (FIG. 2B). The conversion from SpotBP to $CalBP_{Dip}$ has to predict all of these differences. The overall shape of this $CalBP_{Predicted}$ will strongly resemble the shape of the SpotBP because the $CalBP_{Predicted}$ is a convolution of the SpotBP shape as its scanned velocity is increased by 2× over a distance of ~10-15 mm.

Turning now to FIG. 2A a composite illustration is shown including menu items and a graphical representation of the signals associated with the SpotBP. Turning also to FIG. 2B, a composite illustration is shown including menu items and a graphical representation of the signals associated with the CalBP$_{Dip}$. In these graphs, the x-axis plots position along a wafer plane, while the y-axis plots beam current. In these cases, the beam current exhibits a peak shape near the wafer center at 0 mm. A first difference to take into account is the difference in magnitude of the two shapes. The SpotBP has a peak of $4e^{-5}$ whereas the CalBP$_{Dip}$ peak of $7.4e^{-7}$ A is much smaller because the peak just captures a small portion of this overall beam current. Generating the necessary scalar for this magnitude conversion will be explained later.

A second major difference is the width of the two different spot profiles. The CalBP$_{Dip}$ has a wider width because the profile is the result of a convolution of the SpotBP shape over the ~10-15 mm 2× speed-up distance during the horizontal scan. Theoretically, the CalBP$_{Dip}$ width would be identical to the SpotBP width if the 2× speed-up distance an infinitely small distance. A third major difference is the difference in horizontal center of the spot profiles. The CalBP$_{Dip}$ center will be shifted to the right or left of the SpotBP center depending upon the location of the µ-Slope where the scanned beam is sped up by 2× that results in the "Dip" that is used to create the CalBP$_{Dip}$. If the 10-15 mm 2× speed-up location was symmetrical around 0 mm, the CalBP$_{Dip}$ center would be very close to the SpotBP center.

Figure 3:
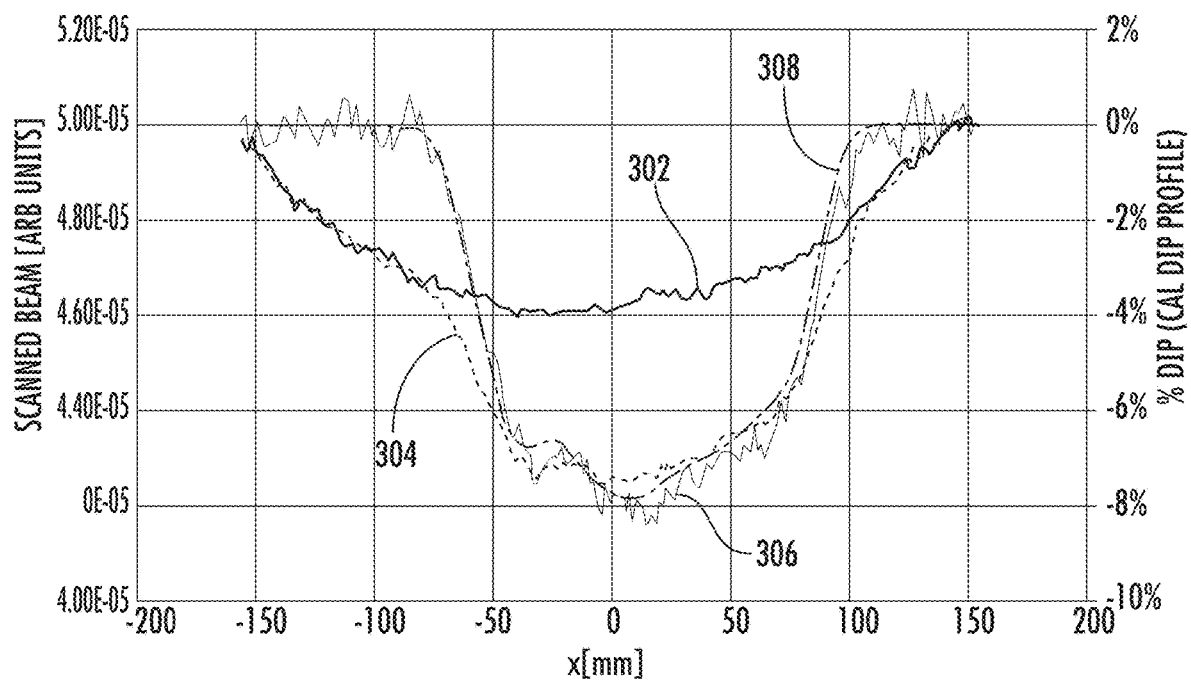
FIG. 3 shows a comparison of various spot beam calibration and measurement curves.

FIG. 3 shows a comparison of a standard Measured CalBP$_{Dip}$ (curve 306) (see also operation Op7, FIG. 1.) to the Predicted CalBP$_{Predicted}$ (curve 308). The curve 302 is the ScannedBP$_{Linear}$ (at constant beam speed) (see also operation Op5, FIG. 1A.). The curve 304 is the ScannedBP$_{Dip}$ (speeds up by 2× over one µ-Slope at 0 mm) (see also operation Op6, FIG. 1). The Measured CalBP$_{Dip}$ is the result of subtracting the ScannedBP$_{Dip}$ from the ScannedBP$_{Linear}$. As can be seen, the Measured CalBP$_{Dip}$ and the Predicted CalBP$_{Predicted}$ (curve 306 and curve 308) overlap one another closely, which close correspondence demonstrates that the Calculation method (described later) can accurately predict what the CalBP$_{Dip}$ would have been.

In accordance with embodiments of the disclosure, the Predicted CalBP$_{Predicted}$ (curve 308) in FIG. 3 is generally derived as explained in the following sequence:

a) In existing approaches, as noted above, after measuring the SpotBP, the next sub-operation in setting up a uniform Scanned Beam is to record a ScannedBP$_{Linear}$, followed by a ScannedBP$_{Dip}$, where the ScannedBP$_{Dip}$ is obtained by increasing one µ-Slope, over a prescribed pitch interval. A µ-Slope is the small distance ~10-15 mm (usually centered close to 0 mm) where the scanned beam speed is increased to 2× to create an intentional beam density "dip" in the middle of the wafer plane.

b) The difference between these two profiles is the CalBP$_{Dip}$.

c) However, this CalBP$_{Predicted}$ can actually be predicted from the (measured) SpotBP and the amplitude and location of the perturbed slope. Accordingly, recording an actual ScannedBP$_{Dip}$ is not needed to determine the CalBP$_{Predicted}$. Rather, the CalBP$_{Predicted}$ may be obtained as a convolution of the SpotBP over the ~10-15 mm µ-Slope speed change distance.

Figure 4:
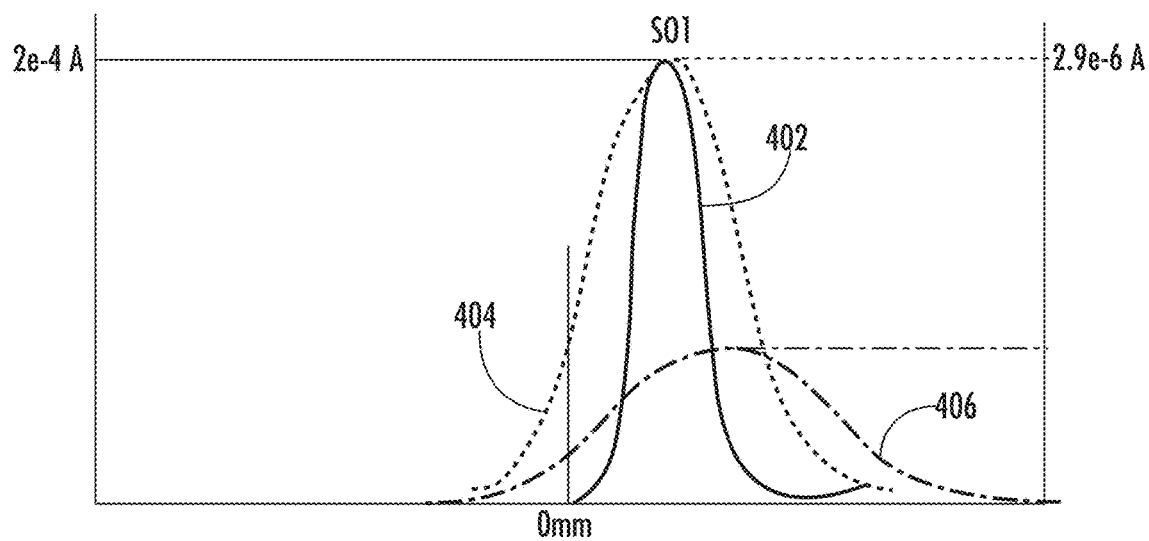
FIGS. 4-8C depict operations involved in conversion of a spot beam profile into a predicted calibration spot profile, in accordance with various embodiments of the disclosure.

In accordance with various embodiments of the disclosure, the FIGS. 4-8C highlight operations (and sub-operations) involved in conversion of a SpotBP into a CalBP$_{Predicted}$. Sub-Operations 4-27 (SO4-SO27) for this SpotBP to CalBP$_{Predicted}$ conversion are all completed in the Op2 computation and consume just a fraction of a second in total to perform. Turning to FIG. 4 there is shown a series of curves, where the curve 402 represents a SpotBP, while the curve 404 represents an "ideal" calibration spot beam profile CalBP$_{Ideal}$, and the curve 406 represents an actual calibration spot profile CalBP$_{Dip}$. The profiles are shown as current (y-axis, meaning the vertical axis in the figures) as a function of position along the wafer plane (x-axis, meaning the horizontal axis). Note that the current scale for the SpotBP (left y-axis) is approximately two orders of magnitude greater than the current scale (right y-axis) for the CalBP$_{Ideal}$, and for the actual CalBP$_{Dip}$. The degree of shifting in relative position along the wafer plane of the CalBP$_{Dip}$ with respect to the SpotBP is exaggerated for purposes of clarity of explanation. Thus, FIG. 4 presents an overview of the results of the various sub-operations (represented by SO1) in the figures to follow.

Figure 5A:
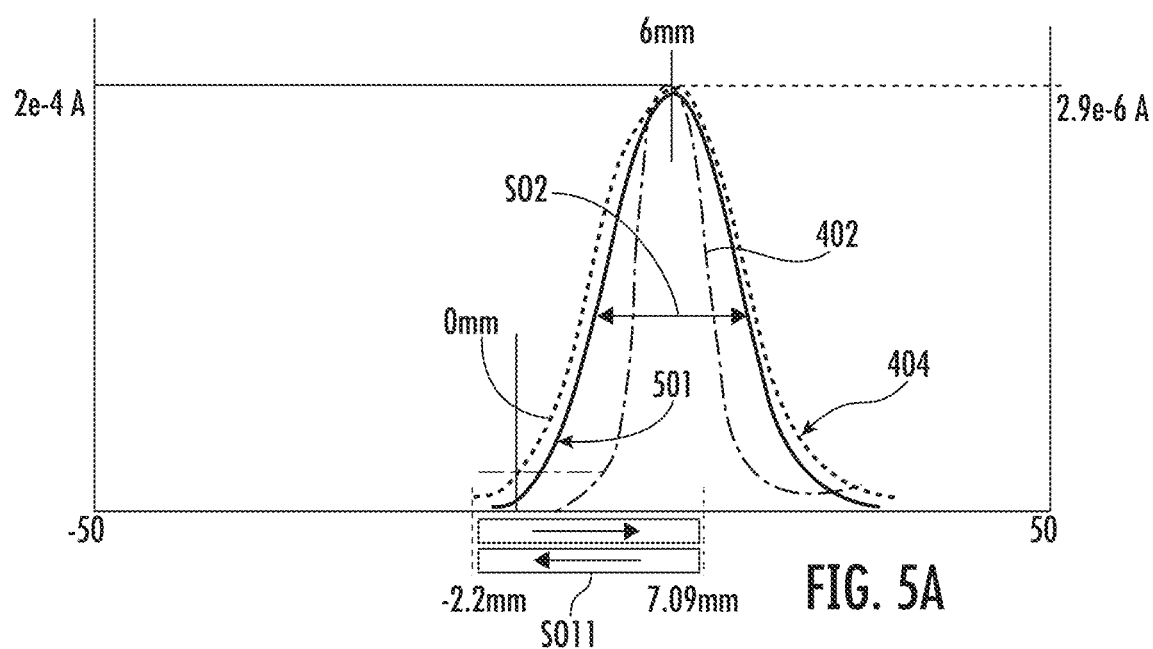

FIG. 5A shows a qualitative illustration (which illustration is labeled SO2) of how the SpotBP (curve 402) is to be "fattened" up with sub-operations to a so-called fattened spot profile SpotBP$_{Fat}$ that has a shape (curve 501) that more closely resembles the CalBP$_{Ideal}$ (curve 404) when the magnitudes are normalized. Again, the current values for the SpotBP (curve 402) and the SpotBP$_{Fat}$ (curve 501) are approximately two orders of magnitude higher with respect to the current values and the CalBP$_{Ideal}$ (curve 404), where the latter profile is represented by the right hand Y-axis.

Figure 5B:
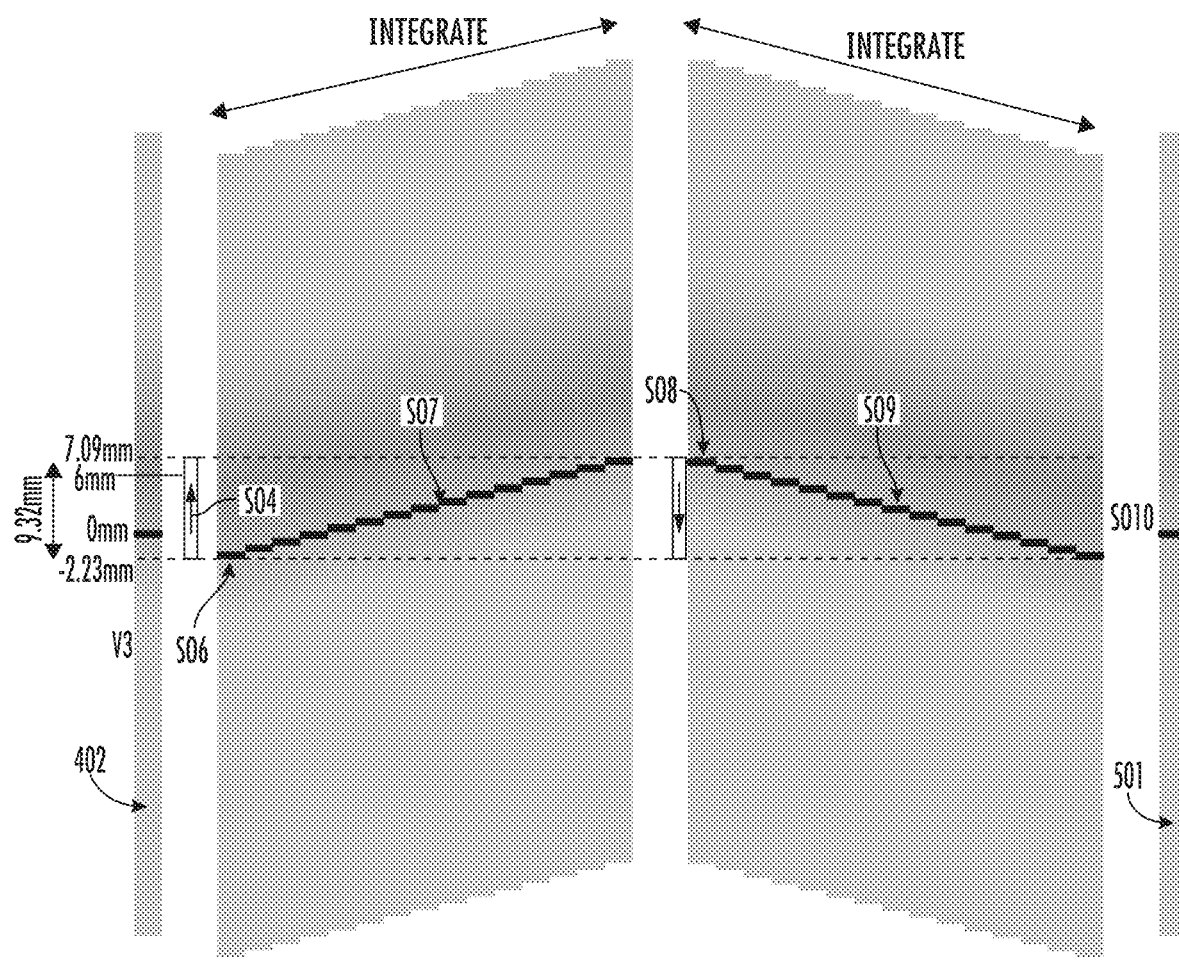

Turning now to FIG. 5B, there is shown a bird's-eye view (V3) of the SpotBP (curve 402) in the leftmost slice, where the SpotBP has a center position of 6 mm. Note that direction of the wafer plane has been shifted to the vertical axis in this figure, where the position of the SpotBP center is indicated along this vertical axis.

In particular, the operations of FIG. 5B illustrate the fattening up of the SpotBP with a convolution routine to create SpotBP$_{Fat}$ (curve 501). At sub-operation SO11, the routine takes into account that for a known Uniformity calibration procedure, the CalBP$_{Dip}$ would have been created by first increasing the scanned beam speed by 2× over a predetermined distance (e.g., 9.32 mm) (µ-Slope width), and then subtracting the scanned profile of this "Dip" ScannedBP$_{Dip}$ from the previously obtained (constant scan speed) ScannedBP$_{Linear}$. This 9.32 mm/2× speed-up of the spot beam scanning is not generally performed exactly symmetrically around the wafer center position at 0 mm. Thus, the actual start and end position (−2.23 mm and 7.09 mm in this example) have to be taken into account as well.

Figure 6A:
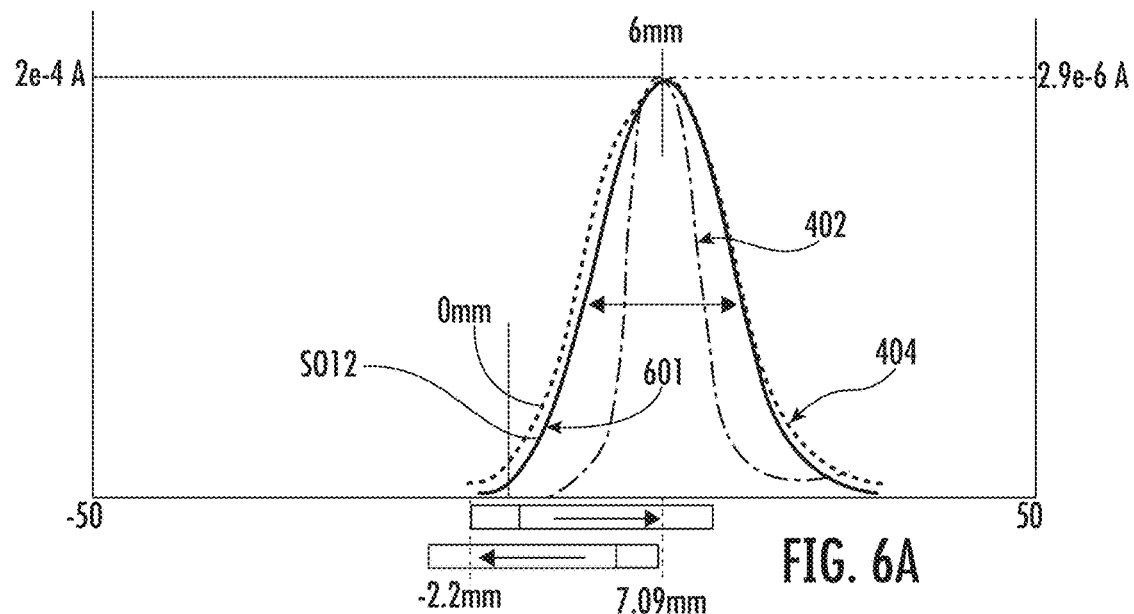
Figure 6B:
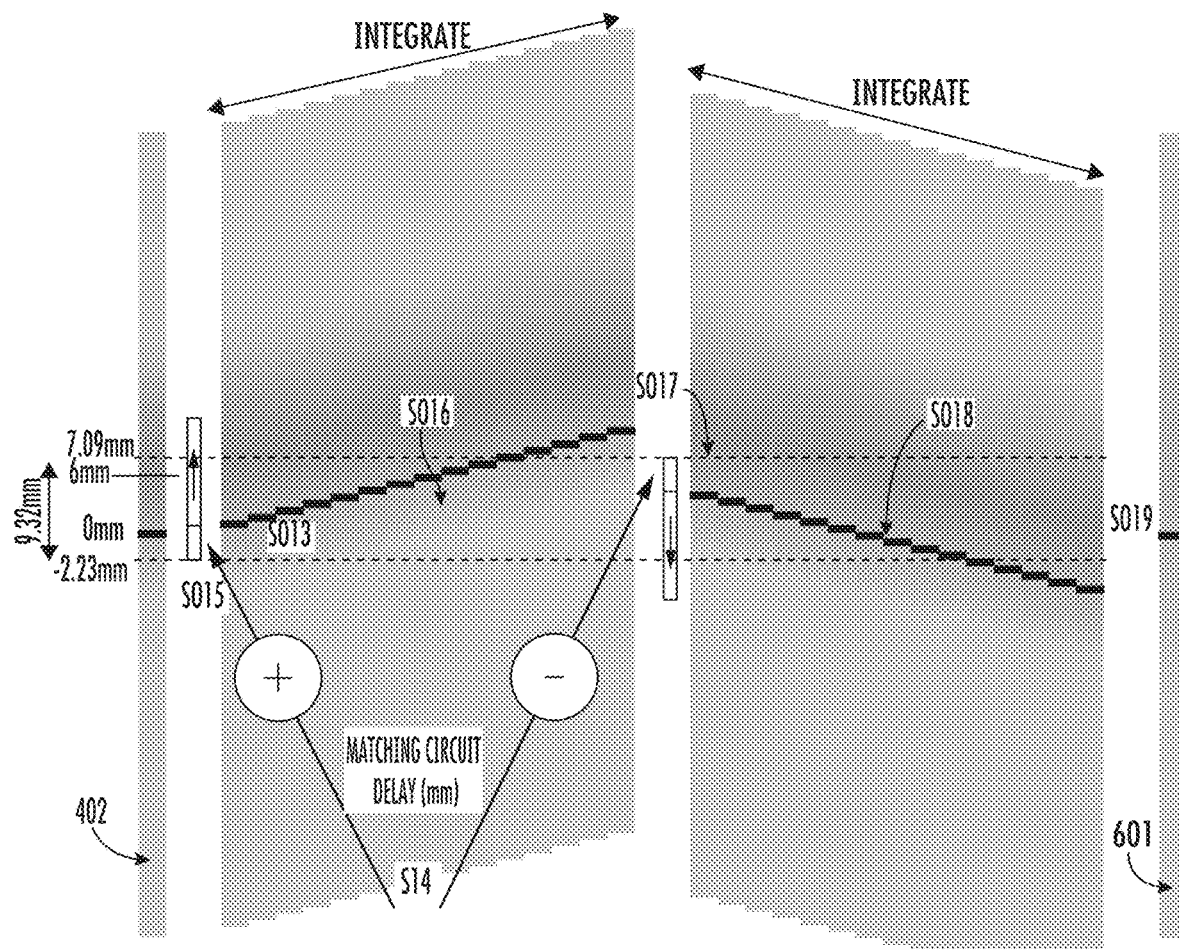

Moreover, in actual spot beam scanning, the beam is scanned back and forth from left to right and right to left, meaning the scanning takes place to scan the beam along the wafer plane (y-axis in FIG. 5B. Thus, the term "right to left" or "left to right" in this context will be understood to be represented by down to up or up to down, as shown in FIG. 5B and also FIG. 6B to follow). In this ideal case, the sub-operation SO4 assumes the 9.32 mm 2× speed-up when the spot beam scans from left to right takes place at the exact same spot as when the spot beam scans right to left. Note: FIG. 6A and FIG. 6B will show that this assumption is not generally true, but for now, this ideal example will be assumed.

To simulate how the SpotBP (curve 402) is "fattened up" during the 2× speed-up over 9.32 mm going from left (negative mm) to right (positive mm), at sub-operation SO6 the SpotBP is shifted backwards so that the undeflected location for the SpotBP of 0 mm lines up with the beginning of the scan speed-up that takes place at −2.23 mm.

In a subsequent sub-operation SO7 a two-dimensional (2D) array is filled in, as this fast profile shape is stepped in suitable increments (in the example, shown, 0.1 mm increments) over a distance of 9.32 mm (with a small rounding error at end).

In a following sub-operation SO8, to simulate how the SpotBP is "fattened up" during the 2× speed-up over 9.32 mm going from right (positive mm) to left (negative mm), the Fast Profile is shifted forwards in sub-operation SO8 so that the undeflected location for the SpotBP of 0 mm lines up with the end of the scan speed-up at 7.09 mm.

In sub-operation SO9, The 2D array continues to fill in, as this SpotBP shape is stepped in 0.1 mm increments or other suitable increments, over a distance of 9.32 mm (with a small rounding error at end).

At this juncture, the 2D array has been filled in with many SpotBPs (932 SpotBPs in the example of FIG. 5B) going from Left to Right in 0.01 mm increments, as well as many SpotBPs (932 SpotBPs in the example of FIG. 5B) going from Right to Left. At sub-operation SO10, the current from all profiles (in the specific example, 1864 profiles) is added together at 0.01 mm increments and then divided by 1,864 to create a $SpotBP_{Fat}$ (curve 501) shown in the shaded portion of the rightmost strip of FIG. 5B). This "fattened up" $SpotBP_{Fat}$ has been normalized to contain the same amount of area (spot current) as the original SpotBP (curve 402).

Note that, as indicated by the sub-operation SO11 in FIG. 5A, this $SpotBP_{Fat}$ (curve 501) still does not match the width of the $CalBP_{Ideal}$ (curve 404). According to embodiments of the disclosure, another "fattening up" factor that may be applied to generate the curve 404, as detailed at FIG. 6A and FIG. 6B.

Turning now to FIG. 6A and FIG. 6B there are shown further sub-operations that may be applied to further fatten up the $SpotBP_{Fat}$. As summarized in FIG. 6A, after these sub-operations are completed (shown collectively as sub-operation SO12), a delayed fattened spot beam profile $SpotBP_{FatDelay}$ (curve 601) will have been created, to more closely match the width of curve 404 $CalBP_{Ideal}$. As shown particularly in FIG. 6A, the current scale of the $SpotBP_{FatDelay}$ profile (curve 601) (left y-axis) is the same as the current scale for the SpotBP (curve 402).

Turning now to FIG. 6B, there are illustrated a series of further sub-operations that may be employed to account for control delays that may introduce detectable lags in scan control. At sub-operation SO13, instead of starting the 2D array with the SpotBP shifted back to −2.23 mm (as specified at sub-operation SO6), in order to more accurately account for delay that is caused in a controller circuit (referred to as a dose Controller matching circuit) the SpotBP may actually be shifted to start a little further to the right (more positive). Again, the right-left terminology with respect to a wafer plane, maps to the up-down direction in the view of FIG. 6B. In existing ion implanters, dose controller electronics may be used that include an inherent delay (a dose controller delay) on the order of microseconds, in the example shown, 6 μSec, between when the dose controller switches from an old scan velocity to a new scan velocity during the horizontal scan. This 6 μSec delay will result in a horizontal (wafer plane, shown vertically in FIG. 6B) shift in the actual response of the spot beam that is proportional to how fast the spot beam is scanning.

At sub-operation S14, the horizontal (wafer plane) shift in a μ-Slope (beam velocity) change based upon the dose controller matching circuit is determined. This shift may be determined as: Matching Circuit Delay (mm)=[Matching Circuit Delay (6 uSec)/BeamSweepTime]/HorizontalScanDistance. The 6.4 μs "Match Circuit" delay (the time from requesting a change in the beam scan velocity (μ-Slope) to when the μ-Slope beam scan velocity change actually occurs) has the effect of broadening the $SpotBP_{FatDelay}$ (curve 601), and is included here in the $SpotBP_{FatDelay}$ calculation. In various embodiments, this shift may be a value spanning a range from ~1 mm to ~8 mm depending upon the sweep time of the beam and the horizontal scan distance employed to scan the spot beam.

At sub-operation SO15, to simulate how the SpotBP is "fattened up" during the 2× speed-up over 9.32 mm going from left (negative mm) to right (positive mm), the Fast Profile is shifted backwards so that the undeflected location of 0 mm lines up with the beginning of the speed-up at −2.23 mm PLUS the matching circuit delay, which delay is 2.5 mm in the example of FIG. 6B. This matching circuit delay portion is shown pictorially as the smaller rectangles, adjacent the larger scan rectangles.

In a following sub-operation SO16, the 2D array is filled in as this SpotBP shape is stepped in suitable increments, such as 0.1 mm increments, over a suitable distance, such as 9.32 mm (with small rounding error at the end).

At sub-operation SO17, to simulate how the Fast Profile is "fattened up" during the 2× speed-up over 9.32 mm going from right (positive mm) to left (negative mm), the Fast Profile is shifted forwards so that the undeflected location of 0 mm lines up with the end of the speed-up at 7.09 mm MINUS the matching circuit delay, such as 2.5 mm in the example shown.

At sub-operation SO18, the 2D array continues to fill in as this SpotBP shape is stepped in suitable increments, such as 0.1 mm increments, over a suitable distance, such as 9.32 mm (with small rounding error at the end).

At this juncture, in the example of FIG. 6B, the 2D array has been filled in with 932 SpotBPs going from Left to Right in 0.01 mm increments and 932 going from Right to Left. In operation SO19, the current from all 1,864 profiles is added together at 0.01 mm increments and then divided by 1,864 to create a $SpotBP_{FatDelay}$ profile (shown in the shaded portion of the rightmost strip of FIG. 6B, and as curve 601 in FIG. 6B). This "fattened up" $SpotBP_{FatDelay}$ has been normalized to contain the same amount of area (spot current) as the SpotBP. Furthermore, this $SpotBP_{FatDelay}$ also includes the matching circuit delay, so that the $SpotBP_{FatDelay}$ more closely matches the width of the $CalBP_{Ideal}$ (curve 404).

Figure 7A:
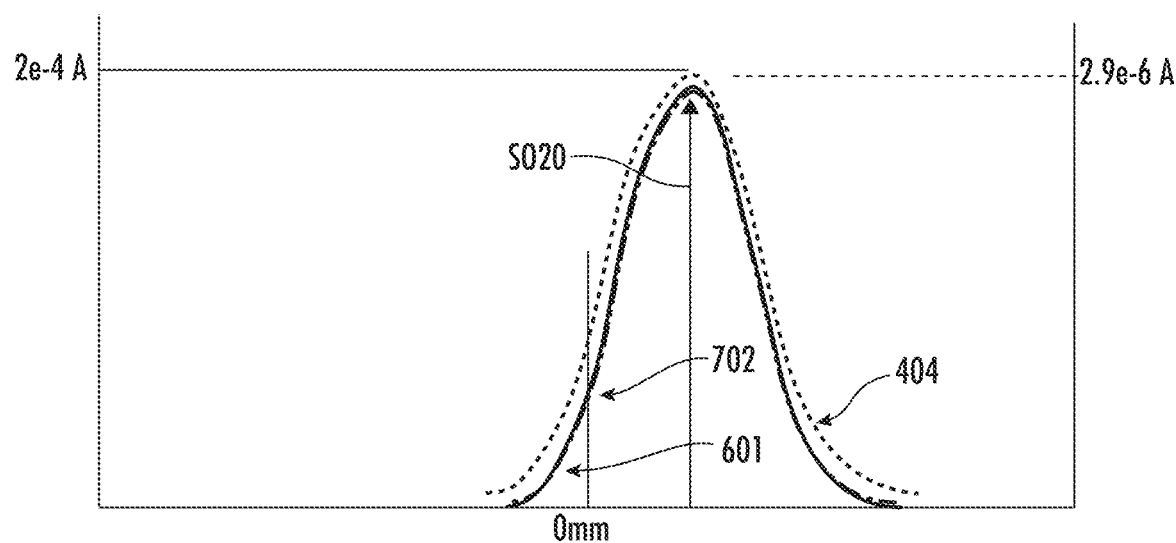

At this juncture, the $SpotBP_{FatDelay}$ (curve 601) width has been calculated so that the width matches closely to the $CalBP_{Ideal}$ (curve 404). Turning to FIG. 7A, in operation SO20, an Area Scalar is applied to create a $CalBP_{FatDelayArea}$ (curve 702) shape that has the same height as the $CalBP_{Ideal}$ (curve 404). After this scalar is applied, the predicted Cal Spot shape (as represented by the $CalBP_{FatDelayArea}$ (curve 702) should closely superimpose upon the $CalBP_{Ideal}$ (curve 404) using the same vertical current axis, as shown in FIG. 7A.

Figure 7B:
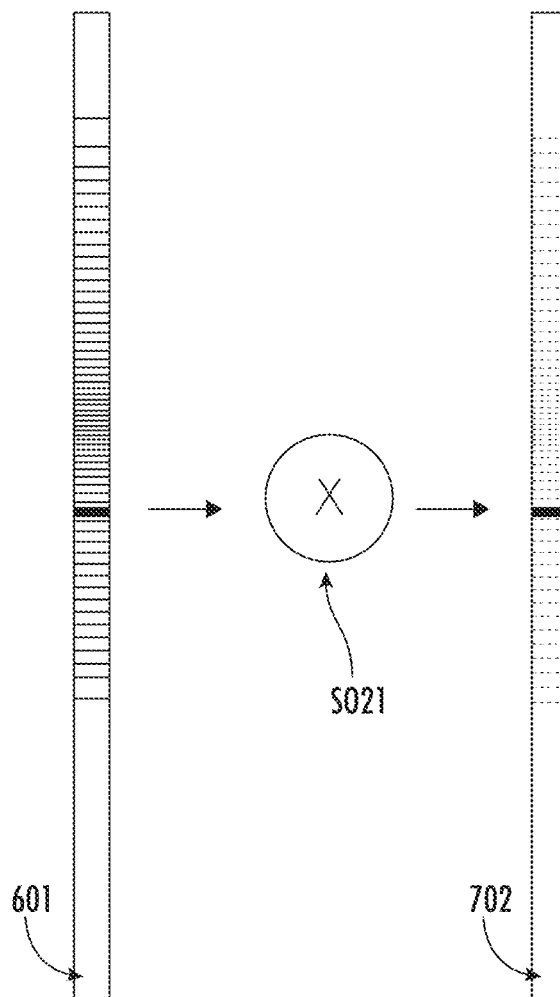

FIG. 7B depicts a sub-operation SO21 where this Area Scalar is applied by multiplying each current element in the $SpotBP_{FatDelay}$ (curve 601) array in the following manner: Scalar=[μ-Slope width]/HorizontalScanDistance]/2. This scalar can be explained geometrically by following how the density of the spot beam changes as the spot beam is scanned in the following steps, as shown in FIG. 7C.

Figure 7C:
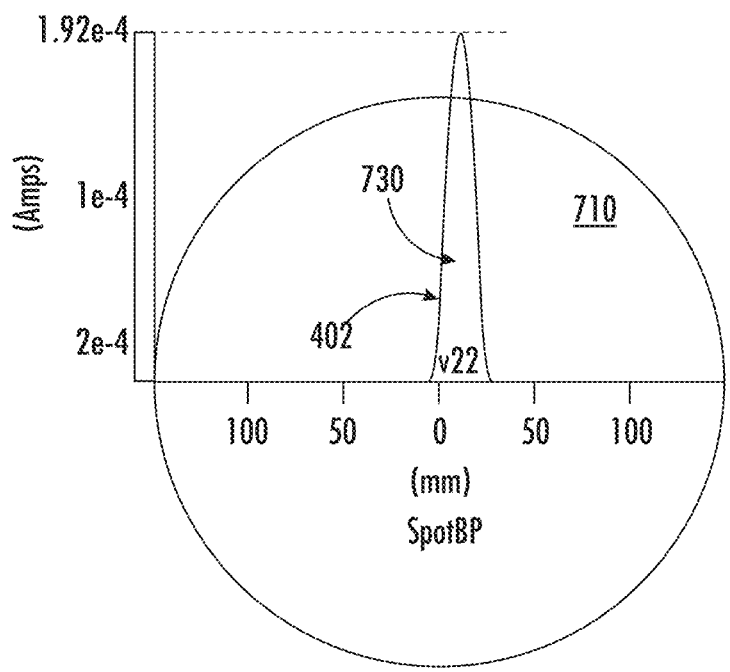

FIG. 7C is a composite illustration, depicting a top plan view of a substrate 710, as well as a graph showing beam current (Y or vertical axis) as a function of position along the wafer plane (x-axis or horizontal axis) of substrate 710. Note the scale in mm along the x-axis is the same for the depiction of the substrate 710, as well as the SpotBP (reference number "402" is used to show that the SpotBP of FIG. 7C corresponds to curve 402), shown as current as a function of horizontal position, along the wafer plane or x-axis. In the example shown, the substrate 710 is a 300 mm wafer, where the view V22 shows the original SpotBP ("402") in shading and the horizontal position of the SpotBP ("402") relative to the substrate 710.

Figure 7D:
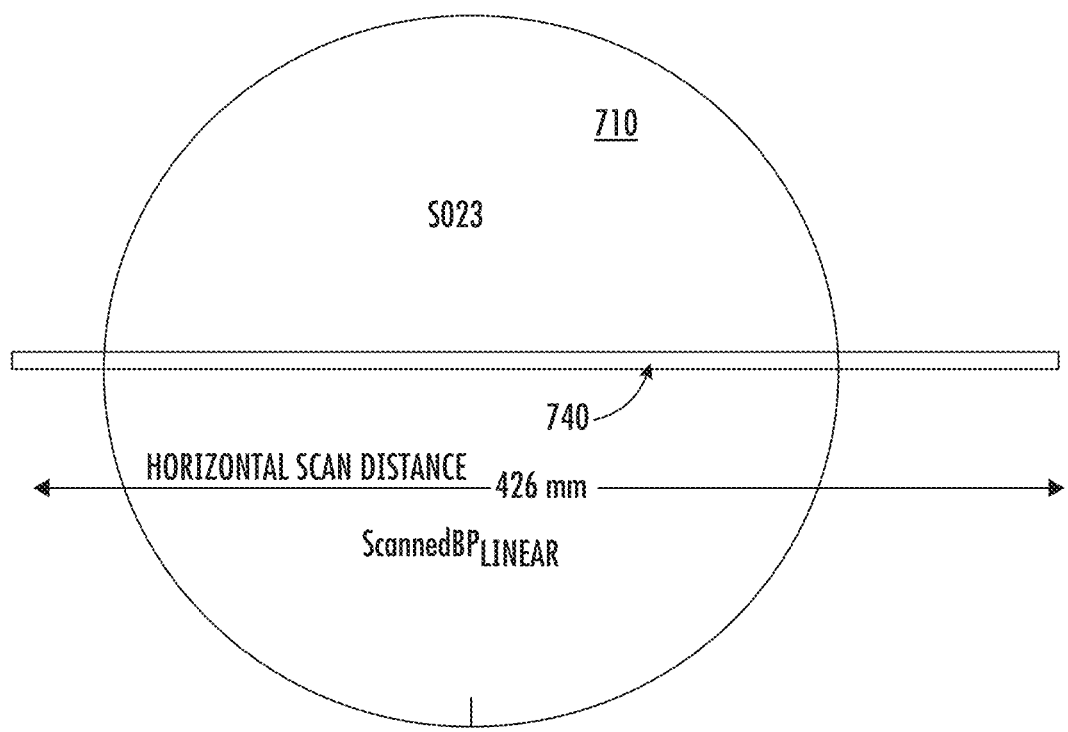

Turning now to FIG. 7D, there is shown another composite illustration, including a plan view of the substrate 710. The scan direction along the wafer plane for the spot beam in this view is also right to left in the figure. The scan distance of an exemplary scan routine is shown by the double sided arrow and may be 426 mm for treating a 300 mm wafer, as shown. In FIG. 7D, in sub-operation SO23, the beam density is spread out in an ideal "rectangle" as the spot beam is scanned across the HorizontalScanDistance of 426 mm. The total area of the Linear Scanned Profile (rectangle 740) is the same as the SpotBP area (area 730, see FIG. 7C)=2.99e-3 (A×mm). Note the scanned $BP_{linear}$ peak is equal to SpotBP area (area 730)/scanned distance (426 mm)=7.02e-6(A).

Figure 7E:
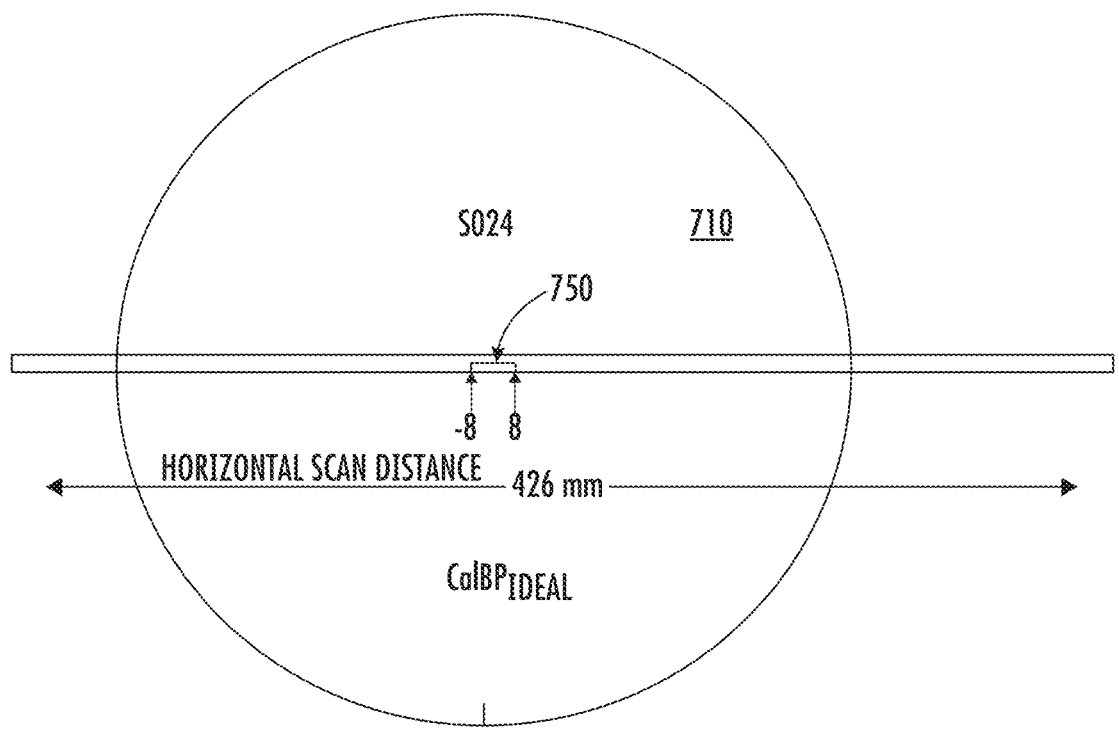

Turning now to FIG. 7E this figure pictorially illustrates the components of a sub-operation 24, where the ratio of the $CalBP_{Ideal}$ area to overall $ScannedBP_{Linear}$ area is calculated. The relative area of the $CalBP_{Ideal}$ "Dip" in $ScannedBP_{Linear}$ when the spot beam scan rate is sped up by 2× over the μ-Slope distance of 16 mm is shown as rectangle 750, (in this example the 2× speed up μ-Slope width is symmetrical around 0 mm and extends from −8 mm to 8 mm). The height of the "Dip" is ½ the height of the Linear Scanned Profile height, because the density of the beam is reduced by ½ as the spot beam scan rate is sped up by 2×. The width of the "Dip" rectangle is 16 mm. In sub-operation SO24, using these rectangle dimensions, the ratio of the $CalBP_{Ideal}$ "Dip" area corresponding to rectangle 750 to the overall $ScannedBP_{Linear}$ area=$CalBP_{Ideal}$(Area Ratio)=[μ-Slope width/HorizontalScanDistance]/2=[16 mm/426 mm]/2=0.0188. The $CalBP_{Ideal}$ "Dip" area is just 1.88% of the total overall $ScannedBP_{Linear}$ Area (which area is the total integrated SpotBP current).

Figure 8A:
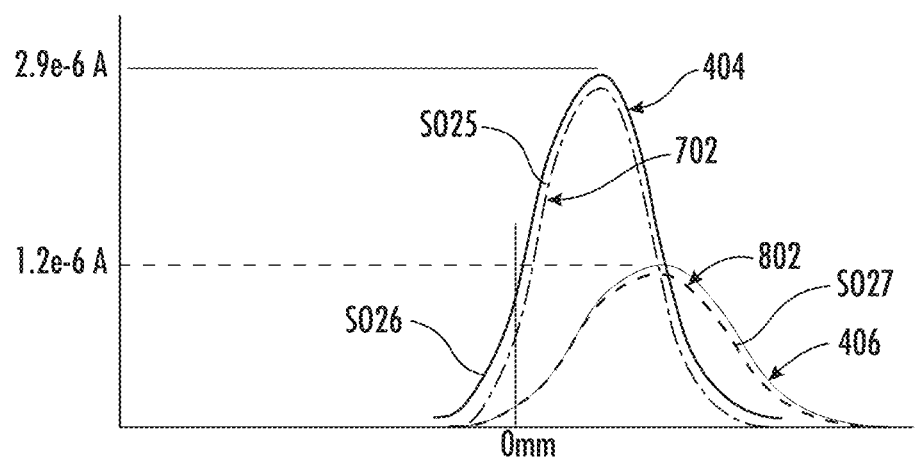

Turning now to FIG. 8A, there is shown a series of curves showing beam current as a function of position, where an area scaled delayed fattened spot beam profile $CalBP_{FatDelayArea}$ (curve 702) has been created, which profile matches very closely to the "Ideal" $CalBP_{Ideal}$ (curve 404). Up to this juncture the calibration routine has been referring to the "Ideal" $CalBP_{Ideal}$ (curve 404). This $CalBP_{Ideal}$ shape may be attained when a sensor, such as a faraday cup, is profiled across the scanned spot beam at a very slow speed (for obtaining the Linear scanned profile and the Dip scanned profile). The factor that alters the ideal shape of the $CalBP_{Ideal}$ is termed the Profiler Speed Transient Response. According to various embodiments of the disclosure, the prediction of the calibration spot profile $CalBP_{Predicted}$ may take this transient response into account.

When a beam control system measures the scanned spot beam current density across the wafer plane using a current detector such as a moving profiler faraday cup (as is done for collection of the $ScannedBP_{Linear}$, the $ScannedBP_{Dip}$ and the $ScannedBP_{Adjusted}$) the detected signals from the detector are filtered by a detector filter, such as a low pass filter to remove and average the high frequency noise created by the high speed electrostatic scan (recall that scanning rates for the scanned spot beam are often in the range of a few kilohertz). In current ion beam control systems, the low pass filter may be a 3 Hz one pole low pass filter. Because the filter response of the filter is a slow transient response, the low pass filter will filter the $CalBP_{Ideal}$ according to the mechanical profile speed. The "Dip" in the $ScannedBP_{Dip}$ is measured such that the profiler travels from left (negative) to right (positive) across the wafer plane. For purposes of illustration, if the profiler Faraday cup detector is set to move very slowly (~4 mm/sec) the transient response of the 3 Hz filter in the Faraday cup detector electronics has time to charge and discharge as the faraday cup passes over the 2× reduction in beam density (Dip). This slow moving faraday circumstance would create close to an "Ideal" Calibration Spot Profile $CalBP_{Ideal}$ (curve 404) as indicated by sub-operation SO26.

However, profiling a single scanned beam profiled at 4 mm/sec would take approximately 8× more time (96 seconds vs 12 seconds) to complete the profile, which circumstance would cause an unacceptable increase in calibration time. In order to achieve a targeted duration for collecting a profile of ~12 sec, the profiler detector velocity is set at 32 mm/Sec. As the velocity of the profiler detector is sped up to 32 mm/sec, the transient response of the 3 Hz filter may not keep up with the change in the beam current as the profiler detector is swept more quickly by the 2× reduction in beam current (Dip). Therefore, in sub-operation 27, a profiler speed transient response factor based upon the profiler speed of 32 mm/sec is applied to the $CalBP_{Ideal}$ (curve 404) to create the final $CalBP_{Predicted}$ (curve 802). This curve is reduced in current magnitude, stretched horizontally along the wafer plane, and shifted to the right, in this example, because the profiler detector measures the beam current when moving from left to right. This final $CalBP_{Predicted}$ (curve 802) should overlap very closely to the original $CalBP_{Dip}$ (curve 406).

Figure 8B:
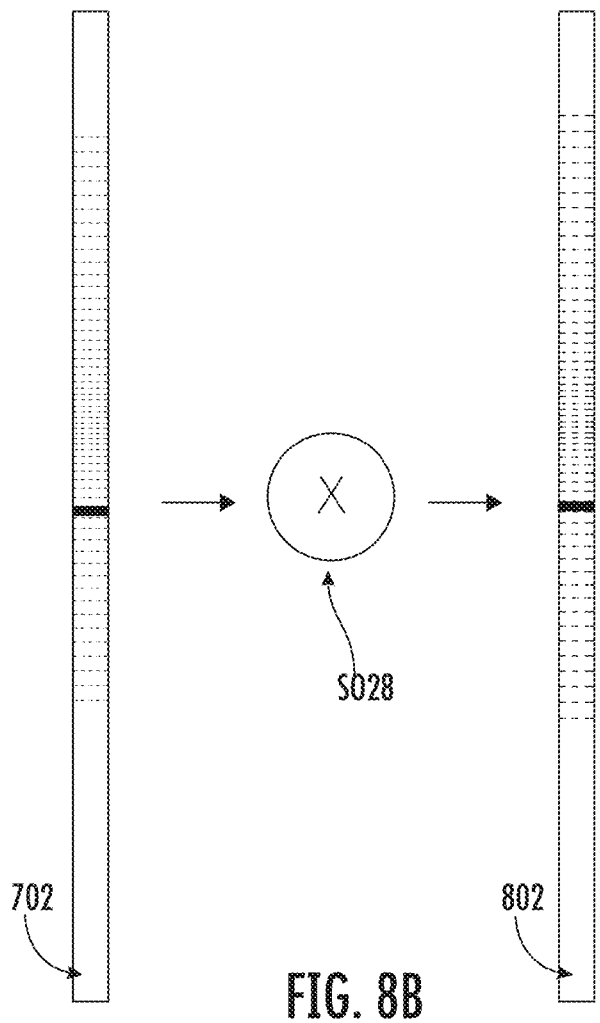

Turning to FIG. 8B, there is shown schematically the Faraday cup Filter transient response that is to be applied (indicated by a sub operation SO28) to the $CalBP_{FatDelayArea}$ (curve 702) in order to finally generate $CalBP_{Predicted}$ (curve 802). This example assumes the profiler Faraday cup scan velocity is sped up from an ideal speed of 4 mm/Sec to a practical speed of 32 mm/sec. Note that according to other embodiments, the profiler detector speed may be set even faster at 96 mm/Sec. In such case, the sub-operation SO28 will further lower the magnitude of the $CalBP_{Predicted}$ (curve 802) and stretch the width and shift the position of $CalBP_{Predicted}$ (curve 802) more to the right in FIG. 8A.

Figure 8C:
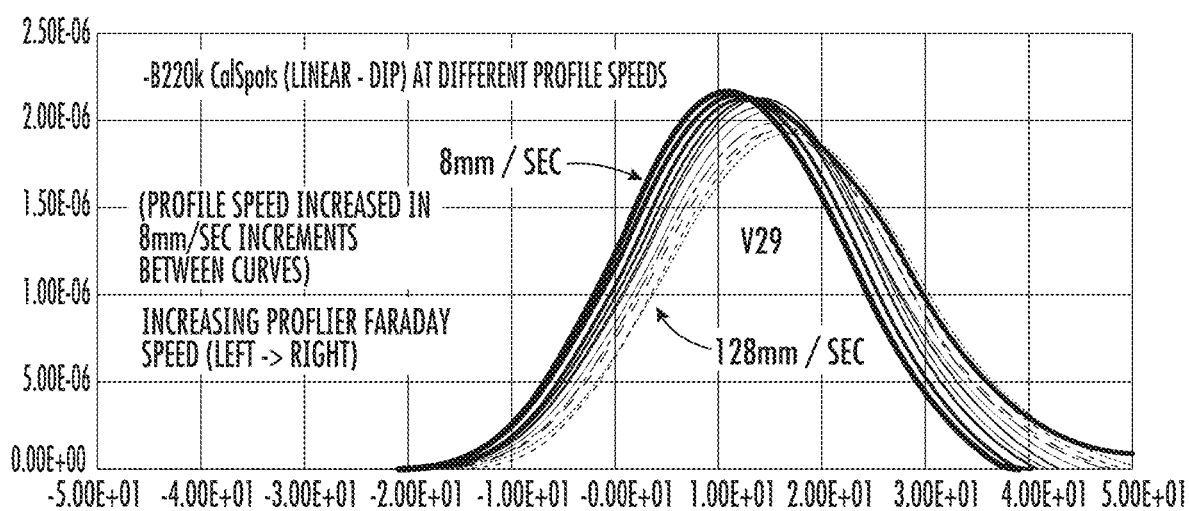

FIG. 8C shows an overview V29 of the effect of increasing profile detector speed for successive $ScannedBP_{Linear}$ and $ScannedBP_{Dip}$ profiles and their resulting calibration spot profiles $CalBP_{Dip}$. In particular, a series of Calibration Spot Profiles $CalBP_{Dip}$ at different profiler speeds for the same Boron 220 kV beam. The leftmost and tallest Cal Spot profile $CalBP_{Dip}$ as obtained based upon a profiler detector speed of 8 mm/sec to collect the $ScannedBP_{Linear}$ and the $ScannedBP_{Dip}$ where ($CalBP_{Dip}$=$ScannedBP_{Linear}$−$ScannedBP_{Dip}$). The shortest and most rightwardly shifted $CalBP_{Dip}$ was measured when the profiler was moved at 128 mm/sec in this example, scanned profile filtering is turned off. According to embodiments of the disclosure, this transient response is therefore to be modelled depending upon the speed of the profiler detector.

Figure 9A:
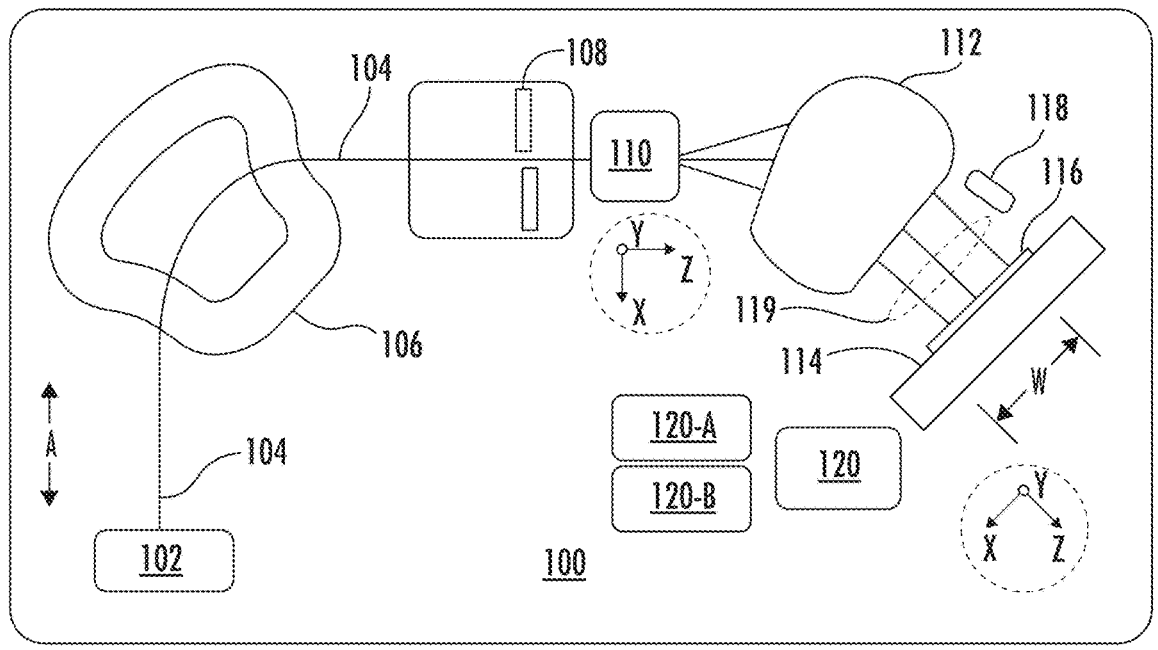
FIG. 9A depicts a top plan view in block form of a beamline ion implanter, in accordance with various embodiments of the disclosure.

FIG. 9A depicts a top plan view in block form of a beamline ion implanter, shown as the ion implanter 100, in accordance with various embodiments of the disclosure. The ion implanter 100 includes an ion source 102 configured to generate an ion beam 104. The ion beam 104 may be provided as a spot beam scanned along a direction, such as the X-direction. In the convention used herein, the Z-direction refers to a direction of an axis parallel to the central ray trajectory of an ion beam 104. Thus, the absolute direction of the Z-direction, as well as the X-direction, where the X-direction is perpendicular to the Z-direction, may vary at different points within the ion implanter 100 as shown. The ion beam 104 may travel through an analyzer magnet 106, mass resolving slit 108, and through a collimator 112 before impacting a substrate 116 disposed on substrate stage 114. The substrate stage 114 may be configured to scan the substrate 116 at least along the Y-direction in some embodiments. In the example shown in FIG. 1, the ion implanter 100 includes a beam scanner 110. When the ion beam 104 is provided as a spot beam, the beam scanner 110 may scan the ion beam 104 along the X-direction, producing a scanned ion beam, also scanned at the substrate along the X-direction. The width of the resulting scanned spot beam may be comparable to the width W of the substrate 116.

In various non-limiting embodiments, the ion implanter 100 may be configured to deliver ion beams for "low" energy or "medium" energy ion implantation, such as a voltage range of 1 kV to 300 kV, corresponding to an implant energy range of 1 keV to 300 keV for singly charged ions. As discussed below, the scanning of an ion beam provided to the substrate 116 may be adjusted depending upon calibration measurements before substrate ion implantation using a scanned ion beam.

The ion implanter 100 further includes a current detector 118 such as a closed loop current detector, and in particular a closed loop Faraday current detector (CLF), for monitoring beam current provided to the substrate 116. The current detector 118 is disposed to intercept the ion beam 104 and may be configured to record beam current of the ion beam 104 during various calibration operations, as discussed above.

The ion implanter 100 also includes a beam calibration component 120. The beam calibration component 120 may be coupled to the beam scanner 110 as well as current detector 118. The beam calibration component 120 may be coupled to one or more components to adjust scanning of the ion beam 104, in order to provide more uniform ion implantation into the substrate 116 as a result of calibration procedures. The beam calibration component 120 may include logic to determine a calibrated spot profile $CalBP_{Predicted}$ based upon application of various beam measurements, and the application of routines based upon these measurements, in order to predict the calibrated spot profile $CalBP_{Predicted}$, as described in the aforementioned examples. The logic may further generate adjustment signals for adjusting scanning of the ion beam 104 based upon the $CalBP_{Predicted}$. In some instances, the logic of beam calibration component 120 may be implemented in a combination of software and hardware, or firmware. In some examples the beam calibration component 120 may include circuitry such as a controller 120-A and memory 120-B that is coupled to software to execute instructions for adjusting the scanning of ion beam 104, based upon the determination of a $CalBP_{Predicted}$. The embodiments are not limited in this context.

Figure 9B:
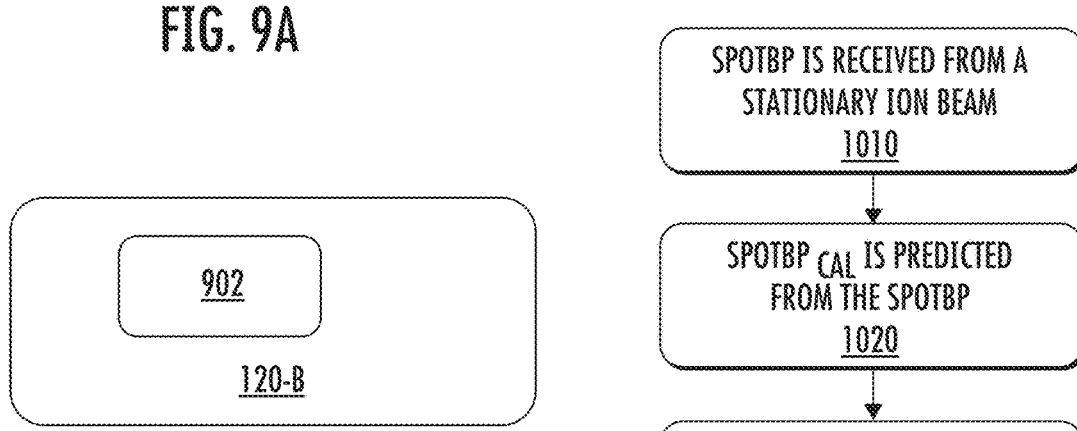
FIG. 9B shows an exemplary block diagram of memory, including a spot beam calibration routine.

Turning to FIG. 9B there is shown a block diagram of memory 120-B, including a spot beam calibration routine 902. The spot calibration routine 902 may store instructions for implementing the aforementioned operations, including operations Op1, Op3, Op5, Op8, and Op9 as generally described above, and in particular, the sub-operations SO4-SO31. These operations of spot beam calibration routine 902 may be implemented by logic, either in stand-along form, or resident in electronic processing circuitry, such as controller 120-A.

Figure 10:
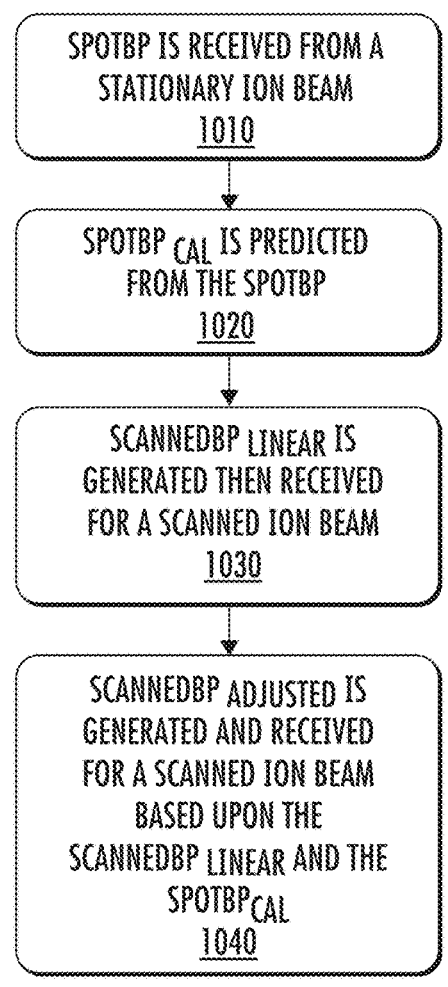
FIG. 10 depicts an exemplary process flow

FIG. 10 illustrates a process flow 1000, in accordance with embodiments of the disclosure. At block 1010, a spot beam profile SpotBP is received for a spot ion beam. In one embodiment, the SpotBP is measured by scanning a profiler Faraday cup detector across an undeflected stationary spot beam. In another embodiment, the SpotBP is obtained when a profiler faraday cup sensor remains stationary in the center of a wafer plane at 0 mm and a spot beam is swept across the profiler faraday cup sensor several times.

At block 1020, The calculated $CalBP_{Predicted}$ may be determined by implementing a so-called predicted calibration spot profile PCSP routine, as generally described with respect to FIGS. 4-8C. In particular, the PCSP routine, as well as any of the aforementioned routines, may be stored in a computer readable medium, for execution as instructions by components of the computer, such as a memory or memory unit. These instructions may be implemented using electronic processing circuitry, which circuitry may be referred to as a controller, processor, or electronic processor. In particular, the PCSP routine may be implemented using a controller embodied in an electronic processor or processors to perform the operations as detailed in FIGS. 4-8C, for example.

In particular embodiments, the PCSP routine may include:
 The SpotBP shape and position;
 The horizontal beam scan distance
 The size and position of the μ-Slope normally used to create a beam density "dip";
 Any matching circuit delay in the beam scan electronics.
 Any filter transient response artifact due to the profiler Faraday electronics and mechanical motion velocity.

As previously mentioned, Sub-Operations 4-27 (FIGS. 4-8C) the calculate the $CalBP_{Predicted}$ are all completed in the Op2 computation and consume just a fraction of a second in total.

At block 1030, a linear scanned beam profile $ScannedBP_{Linear}$ is received. The $ScannedBP_{Linear}$ may be generated when current is measured while the spot ion beam of block 1010 is scanned across a predetermined horizontal scan distance at a constant velocity. The scan velocity of the spot beam is represented by curve 404. This $ScannedBP_{Linear}$ may take several seconds, such as ~12 seconds to perform.

At block 1040, an adjusted Scanned Profile $ScannedBP_{Adjusted}$ is taken for the spot beam, based upon the $ScannedBP_{Linear}$ and the $CalBP_{Predicted}$ to make the necessary changes to the velocity of the spot beam as the spot beam is scanned to achieve uniform beam density across the wafer plane.

The present embodiments provide at least the following advantages. As a first advantage, by following the operations listed above, a SpotBP can be used to accurately predict the shape size and position $CalBP_{Predicted}$ of the Dip Calibration Spot profile $CalBP_{Dip}$. As a second advantage, by obviating the necessity for performing a Dip Calibration Scanned Profile, $ScannedBP_{Scanned}$, this approach will result in significant tune time improvements of up to 13% as the beam tune times on medium current ion implanters approaches.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   receiving a spot beam profile for a spot ion beam;
   receiving a linear scanned beam profile for the spot ion beam;
   generating a calculated calibration spot profile, based upon the spot beam profile and the linear scanned beam profile; and
   implementing an adjusted scanned profile for the spot ion beam, based upon the calculated calibration spot profile,
   wherein the adjusted scanned profile is obtained by:
      generating, based on the calculated calibration spot profile, a scanned waveform for the spot ion beam with scan speed adjustments to vary scan speed along a horizontal beam scan axis;
      measuring, with a mechanical profile detector, beam current density of the scanned waveform along the horizontal beam scan axis; and
      determining the measured beam current density to be below a beam current uniformity specification limit.

2. The method of claim 1, the generating the calculated calibration spot profile comprising generating a fattened spot beam profile by performing a convolution operation upon the spot beam profile.

3. The method of claim 2, the generating the calculated calibration spot profile further comprising generating a delayed fattened spot beam profile by adjusting the fattened spot beam profile by a dose controller delay of a controller used to control the spot ion beam.

4. The method of claim 3, the generating the calculated calibration spot profile further comprising applying an area scalar to the delayed fattened spot beam profile, to generate an area scaled delayed fattened spot beam profile, where the area scalar is determined from a ratio of an ideal calibration spot beam profile to an area of the linear scanned beam profile.

5. The method of claim 4, the generating the calculated calibration spot profile further comprising applying a profiler Speed Transient Response factor to the area scaled delayed fattened spot beam profile, based upon a filter response for a detector filter used to generate the linear scanned beam profile.

6. The method of claim 1, wherein the spot beam profile is measured by scanning a current detector across an undeflected stationary spot beam.

7. The method of claim 1, wherein the linear scanned beam profile is generated by scanning the spot ion beam across a predetermined horizontal scan distance at a constant velocity.

8. An apparatus for controlling scanning of an ion beam, comprising:
   a beam scanner to scan a spot ion beam with respect to a substrate;
   a detector, to measure current of the spot ion beam; and
   a beam calibration component, comprising a controller and a memory, the memory comprising a calibration routine, operative on the controller to
      receive a spot beam profile for the spot ion beam;
      receive a linear scanned beam profile of the spot ion beam;
      generate a calculated calibration spot profile, based upon the spot beam profile and the linear scanned beam profile; and
      implement an adjusted scanned profile for the spot ion beam, based upon the calculated calibration spot profile,
      wherein the adjusted scanned profile is obtained by:
         generating, based on the calculated calibration spot profile, a scanned waveform for the spot ion beam with scan speed adjustments to vary scan speed along a horizontal beam scan axis;
         measuring, with a mechanical profile detector, beam current density of the scanned waveform along the horizontal beam scan axis; and
         determining the measured beam current density to be below a beam current uniformity specification limit.

9. The apparatus of claim 8, the calibration routine, operative on the controller to generate the calculated calibration spot profile by generating a fattened spot beam profile by performing a convolution operation upon the spot beam profile.

10. The apparatus of claim 9, the calibration routine, operative on the controller to generate the calculated calibration spot profile by further generating a delayed fattened spot beam profile by adjusting the fattened spot beam profile by a dose controller delay of a dose controller used to control the spot ion beam.

11. The apparatus of claim 10, the calibration routine, operative on the controller to generate the calculated calibration spot profile by further applying an area scalar to the delayed fattened spot beam profile, to generate an area scaled delayed fattened spot beam profile, where the area scalar is determined from a ratio of an ideal calibration spot beam profile to an area of the linear scanned beam profile.

12. The apparatus of claim 11, the calibration routine, operative on the controller to generate the calculated calibration spot profile by further applying a profiler Speed Transient Response factor to the area scaled delayed fattened spot beam profile, based upon a filter response for a detector filter used to generate the linear scanned beam profile.

13. The apparatus of claim 9, wherein the spot beam profile is measured by scanning a current detector across an undeflected stationary spot beam.

14. The apparatus of claim 9, wherein the linear scanned beam profile is generated by scanning the spot ion beam across a predetermined horizontal scan distance at a constant velocity.

15. A non-transitory computer-readable storage medium including instructions that when executed by a computer, cause the computer to:
   receive a spot beam profile for a spot ion beam;
   receive a linear scanned beam profile of the spot ion beam;
   generate a calculated calibration spot profile, based upon the spot beam profile and the linear scanned beam profile; and
   implement an adjusted scanned profile for the spot ion beam, based upon the calculated calibration spot profile,
   wherein the adjusted scanned profile is obtained by:
      generating, based on the calculated calibration spot profile, a scanned waveform for the spot ion beam with scan speed adjustments to vary scan speed along a horizontal beam scan axis;

measuring, with a mechanical profile detector, beam current density of the scanned waveform along the horizontal beam scan axis; and determining the measured beam current density to be below a beam current uniformity specification limit.

16. The non-transitory computer-readable storage medium of claim 15, wherein the instructions further configure the computer to generate the calculated calibration spot profile by generating a fattened spot beam profile by performing a convolution operation upon the spot beam profile.

17. The non-transitory computer-readable storage medium of claim 16, wherein the instructions further configure the computer to generate the calculated calibration spot profile by further generating a delayed fattened spot beam profile by adjusting the fattened spot beam profile by a dose controller delay of a dose controller used to control the spot ion beam.

18. The non-transitory computer-readable storage medium of claim 17, wherein the instructions further configure the computer to generate the calculated calibration spot profile by further applying an area scalar to the delayed fattened spot beam profile, to generate an area scaled delayed fattened spot beam profile, where the area scalar is determined from a ratio of an ideal calibration spot beam profile to an area of the linear scanned beam profile.

19. The non-transitory computer-readable storage medium of claim 18, wherein the instructions further configure the computer to generate the calculated calibration spot profile by further applying a profiler Speed Transient Response factor to the area scaled delayed fattened spot beam profile, based upon a filter response for a detector filter used to generate the linear scanned beam profile.

* * * * *